(12) United States Patent
Wu et al.

(10) Patent No.: US 11,037,908 B2
(45) Date of Patent: Jun. 15, 2021

(54) BONDED DIE ASSEMBLY CONTAINING PARTIALLY FILLED THROUGH-SUBSTRATE VIA STRUCTURES AND METHODS FOR MAKING THE SAME

(71) Applicant: SANDISK TECHNOLOGIES LLC, Addison, TX (US)

(72) Inventors: Chen Wu, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/521,849

(22) Filed: Jul. 25, 2019

(65) Prior Publication Data

US 2021/0028148 A1 Jan. 28, 2021

(51) Int. Cl.
*H01L 25/00* (2006.01)
*H01L 25/065* (2006.01)
(Continued)

(52) U.S. Cl.
CPC ...... *H01L 25/0657* (2013.01); *H01L 21/7682* (2013.01); *H01L 21/76837* (2013.01);
(Continued)

(58) Field of Classification Search
None
See application file for complete search history.

(56) References Cited

U.S. PATENT DOCUMENTS 5,915,167 A 6/1999 Leedy
8,563,403 B1 10/2013 Farooq et al.
(Continued)

FOREIGN PATENT DOCUMENTS

KR 10-1049380 B1 7/2011

OTHER PUBLICATIONS

Notification of Transmittal of the International Search Report and Written Opinion of the International Search Authority for International Patent Application No. PCT/US2020/024138, dated Jul. 24, 2020, 12 pages.
(Continued)

*Primary Examiner* — Reema Patel
(74) *Attorney, Agent, or Firm* — The Marbury Law Group PLLC

(57) ABSTRACT

A bonded assembly includes a first semiconductor die including a first substrate, first semiconductor devices located on the first substrate, first dielectric material layers located on the first semiconductor devices and embedding first metal interconnect structures, and first through-substrate via structures extending through the first substrate and contacting a respective first metal interconnect structure. Each of the first through-substrate via structures laterally surrounds a respective core cavity that contains a void or a dielectric fill material portion. The bonded assembly includes a second semiconductor die attached to the first semiconductor die, and including a second substrate, second semiconductor devices located on the second substrate, second dielectric material layers located on the second semiconductor devices and embedding second metal interconnect structures, and bonding pad structures electrically connected to a respective one of the second metal interconnect structures and bonded to a respective first through-substrate via structure.

15 Claims, 20 Drawing Sheets

(51) Int. Cl.
- *H01L 25/18* (2006.01)
- *H01L 23/00* (2006.01)
- *H01L 23/48* (2006.01)
- *H01L 21/768* (2006.01)

(52) U.S. Cl.
CPC .. *H01L 21/76852* (2013.01); *H01L 21/76898* (2013.01); *H01L 23/481* (2013.01); *H01L 24/08* (2013.01); *H01L 24/16* (2013.01); *H01L 24/80* (2013.01); *H01L 24/81* (2013.01); *H01L 25/18* (2013.01); *H01L 25/50* (2013.01); *H01L 2224/08146* (2013.01); *H01L 2224/16146* (2013.01); *H01L 2224/80895* (2013.01); *H01L 2224/81815* (2013.01); *H01L 2225/06513* (2013.01); *H01L 2225/06524* (2013.01); *H01L 2225/06544* (2013.01); *H01L 2924/1431* (2013.01); *H01L 2924/14511* (2013.01)

(56) References Cited

U.S. PATENT DOCUMENTS

| | | | |
|---|---|---|---|
| 9,761,559 | B1* | 9/2017 | Shih ............... H01L 24/97 |
| 10,115,681 | B1 | 10/2018 | Ariyoshi |
| 10,283,493 | B1 | 5/2019 | Nishida |
| 10,354,980 | B1 | 7/2019 | Mushiga et al. |
| 10,354,987 | B1 | 7/2019 | Mushiga et al. |
| 2002/0136871 | A1 | 9/2002 | Lockett |
| 2004/0042732 | A1 | 3/2004 | Bruns |
| 2005/0275048 | A1 | 12/2005 | Farnworth et al. |
| 2005/0275049 | A1 | 12/2005 | Kirby et al. |
| 2006/0261340 | A1 | 11/2006 | Farnworth et al. |
| 2007/0002549 | A1 | 1/2007 | Brusso et al. |
| 2007/0246819 | A1 | 10/2007 | Hembree et al. |
| 2009/0189238 | A1 | 7/2009 | Kirby et al. |
| 2011/0136336 | A1 | 6/2011 | Akram et al. |
| 2012/0009717 | A1 | 1/2012 | Kirby et al. |
| 2012/0068313 | A1* | 3/2012 | Pagaila ............... H01L 23/5384 257/621 |
| 2013/0168850 | A1 | 7/2013 | Samoilov et al. |
| 2013/0328209 | A1 | 12/2013 | Selvanayagam et al. |
| 2014/0284793 | A1 | 9/2014 | Samoilov et al. |
| 2015/0061277 | A1 | 3/2015 | Tice et al. |
| 2015/0314535 | A1 | 11/2015 | Tice et al. |
| 2015/0348861 | A1 | 12/2015 | Chia et al. |
| 2016/0204083 | A1 | 7/2016 | Chang et al. |
| 2017/0261708 | A1 | 9/2017 | Ding et al. |
| 2018/0069039 | A1 | 3/2018 | Han |
| 2018/0277497 | A1 | 9/2018 | Matsuo |
| 2019/0221557 | A1 | 7/2019 | Kim et al. |

OTHER PUBLICATIONS

Koifman, V., "Sony vs Samsung in Galaxy S7," Image Sensors World, http://image-sensors-world.blogspot.com/2016/07/sony-vs-samsung-in-galaxy-s7.html, (2016).

Peic, A., "Lithography Process Innovations for 2.5/3D Part 1: Alleviating TSV Stress," Resource Library, Technologies Features, https://www.3dincites.com/2014/08/lithography-process-innovations-for-2-53d-part-1-alleviating-tsv-stress/, (2014).

Fontaine, E., "A Survey of Enabling Technologies in Successful Consumer Digital Imaging Products," http://www.imagesensors.org/Past%20Workshops/2017%20Workshop/2017%20Papers/R06.pdf, (2017).

Ohara, Y. et al., "A Cost Effective Via Last TSV Technology Using Molten Solder Filling for Automobile Application," 2017 IEEE 67th Electronic Components and Technology Conference (ECTC), DOI: 10.1109/ECTC.2017.218, https://ieeexplore.ieee.org/document/7999670, (2017) (Abstract Only).

Gilles, L et al., "Presentation of Different Fine Pitch Interconnection Technologies Developed for Optic Applications," 2018 7th Electronic System-Integration Technology Conference (ESTC), DOI: 10.1109/ESTC.2018.8546364, https://ieeexplore.ieee.org/document/8546364, (2018) (Abstract Only).

Vick, E. et al., "Demonstration of low cost TSV fabrication in thick silicon wafers," 2014 IEEE 64th Electronic Components and Technology Conference (ECTC) DOI: 10.1109/ECTC.2014.6897515, https://ieeexplore.ieee.org/document/6897515 (2014) (Abstract Only).

Fukuzumi, S. et al., "Highly Productive Solder Interconnect Formation by Bump Stabbing for 3D-TSV Die Stacking," 2018 IEEE 68th Electronic Components and Technology Conference (ECTC), DOI: 10.1109/ECTC.2018.00235, https://ieeexplore.ieee.org/document/8429748, (2018) (Abstract Only).

Kuhne, S. et al., "Wafer-level packaging and direct interconnection technology based on hybrid bonding and through silicon vias," Journal of Micromechanics and Microengineering, vol. 21, No. 8, https://iopscience.iop.org/article/10.1088/0960-1317/21/8/085032, (2011) (Abstract Only).

U.S. Appl. No. 15/892,648, filed Feb. 9, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.

* cited by examiner

BONDED DIE ASSEMBLY CONTAINING PARTIALLY FILLED THROUGH-SUBSTRATE VIA STRUCTURES AND METHODS FOR MAKING THE SAME

FIELD

The present disclosure relates generally to the field of semiconductor devices, and particularly to a bonded die assembly containing partially filled through-substrate via structures and methods for making the same.

BACKGROUND

Multiple die stacking and bonding process is typically complex and expensive. Some prior art processes require plural planarization/polishing steps and/or formation of plural additional pad dielectric layers. The planarization processes and formation of additional layers can be costly and time-consuming.

SUMMARY

According to an embodiment of the present disclosure, a bonded assembly is provided, which comprises: a first semiconductor die comprising a first substrate, first semiconductor devices located on the first substrate, first dielectric material layers located on the first semiconductor devices and embedding first metal interconnect structures, and first through-substrate via structures extending through the first substrate and contacting a respective one of the first metal interconnect structures, wherein each of the first through-substrate via structures laterally surrounds a respective core cavity that contains a void or a dielectric fill material portion; and a second semiconductor die attached to the first semiconductor die, and comprising a second substrate, second semiconductor devices located on the second substrate, second dielectric material layers located on the second semiconductor devices and embedding second metal interconnect structures, and bonding pad structures electrically connected to a respective one of the second metal interconnect structures and bonded to a respective one of the first through-substrate via structures.

In one embodiment, the first semiconductor die comprises a memory die including a three-dimensional array of memory elements, and the second semiconductor die comprises a logic die including a peripheral circuitry configured to control operation of the three-dimensional array of memory elements. In another embodiment, the bonded assembly also includes a third semiconductor die attached to the first semiconductor die, and comprising a third substrate, third semiconductor devices located on the third substrate, third dielectric material layers located on the third semiconductor devices and embedding third metal interconnect structures, and additional through-substrate via structures extending through the third substrate and electrically connected to a respective one of the third metal interconnect structures and bonded to a respective one of additional bonding pad structures within the first semiconductor die.

According to another aspect of the present disclosure, a method of forming a bonded assembly is provided, which comprises: providing a first semiconductor die comprising a first substrate, first semiconductor devices located on the first substrate, and first dielectric material layers located on the first semiconductor devices and embedding first metal interconnect structures; forming first through-substrate via openings at least through the first substrate, wherein a top surface of a respective one of the first metal interconnect structures is physically exposed at a bottom of each of the first through-substrate via openings; forming first through-substrate via structures in the first through-substrate via openings by depositing at least one metallic material, wherein a core cavity that is not filled with the at least one metallic material is provided within each of the first through-substrate via openings; providing a second semiconductor die comprising a second substrate, second semiconductor devices located on the second substrate, second dielectric material layers located on the second semiconductor devices and embedding second metal interconnect structures, and bonding pad structures electrically connected to a respective one of the second metal interconnect structures; and bonding the bonding pad structures to a respective one of the first through-substrate via structures, wherein each core cavity includes a void or a dielectric fill material portion after bonding the bonding pad structures to the respective one of the first through-substrate via structures.

DETAILED DESCRIPTION

Figure 1:
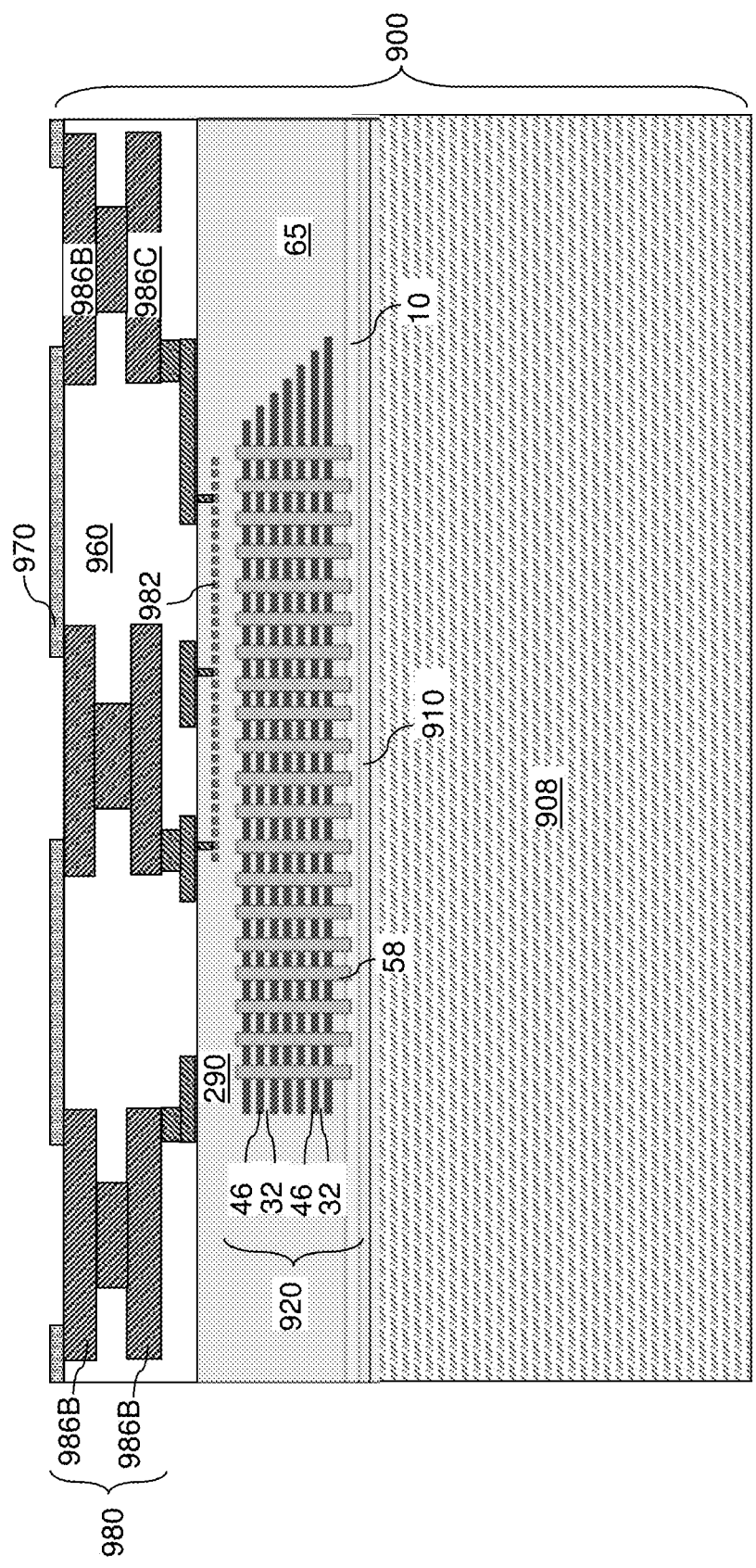
FIG. 1 is a schematic vertical cross-sectional view of a first semiconductor die after formation of first bonding pad structures according to a first embodiment of the present disclosure.

As described above, the embodiments of the present disclosure are directed to a bonded die assembly containing partially filled through-substrate via structures and methods for making the same, the various aspects of which are described herein in detail. The partially filled through-substrate via structures reduce process complexity and cost.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 according to a first embodiment of the present disclosure is illustrated. The first semiconductor die 900 includes a first substrate 908, first semiconductor devices located on, and overlying, the first substrate 908, first dielectric material layers (290, 960, 970) located on, and overlying, the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 can comprise any semiconductor device known in the art. In one embodiment, the first semiconductor die 900 comprises a memory die, and may include a memory device, such as a three-dimensional NAND memory device. In an illustrative example, the first semiconductor devices 920 can include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device. A memory opening fill structure 58 can be formed within each memory opening. A memory opening fill structure 58 can include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Generally, the memory opening fill structures 58 can include any type of non-volatile memory elements such as resistive memory elements, ferroelectric memory elements, phase change memory elements, etc. The memory device 920 may include a horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) can include contact-level dielectric layers 290 embedding contact via structures and bit lines 982, interconnect-level dielectric layers 960 that embed a subset of the first metal interconnect structures 980 located above the contact-level dielectric layers 290, and a first bonding-level dielectric layer 970 that is formed above the interconnect-level dielectric layer 960. The contact via structures contact various nodes of the first semiconductor devices 920. The bit lines 982 can contact a subset of the contact via structures (not shown for clarity) that are connected to the drain regions located over the vertical semiconductor channels. Interconnect metal lines and interconnect metal via structures, which are subsets of the first metal interconnect structures 980 can be embedded in the interconnect-level dielectric layers 960. The first metal interconnect structures 980 include first contact pad structures 986C that are located within a lower portion of the interconnect-level dielectric layers 960 and first bonding pad structures 986B that are located within an upper portion of the interconnect-level dielectric layers 960. The first contact pad structures 986C and the first bonding pad structures 986B are collectively referred to as first metallic pad structures (986C, 986B).

In one embodiment, each of the first bonding pad structures 986B can include an underbump metal stack at an upper portion thereof. As used herein, an "underbump metal stack" or a "UBM stack" refers to any metallic material stack that is configured to be attached to a bonding material, such as a solder bump. Exemplary UBM stacks include an Ni/Au stack, an Ni/Pd stack, and an Ni/Pd/Au stack. In another embodiment, the UBM stack may be omitted from the first bonding pad structures 986B.

Each of the contact-level dielectric layers 290 and the interconnect-level dielectric layers 960 can include a dielectric material such as undoped silicate glass, a doped silicate glass, organosilicate glass, silicon nitride, a dielectric metal oxide, or a combination thereof. The first bonding-level dielectric layer 970 includes a silicon oxide material such as undoped silicate glass or a doped silicate glass. The thickness of the first bonding-level dielectric layer 970 can be in a range from 100 nm to 3,000 nm, although lesser and greater thicknesses can also be employed. The first bonding-level dielectric layer 970 can have a planar top surface. Openings may be formed through the first bonding-level dielectric layer 970 such that the top surfaces of the first bonding pad structures 986B are be physically exposed in the openings through the first bonding-level dielectric layer 970. Alternatively, the openings through the first bonding-level dielectric layer 970 may be formed at a subsequent processing step after formation of first through-substrate via structures.

Figure 2:
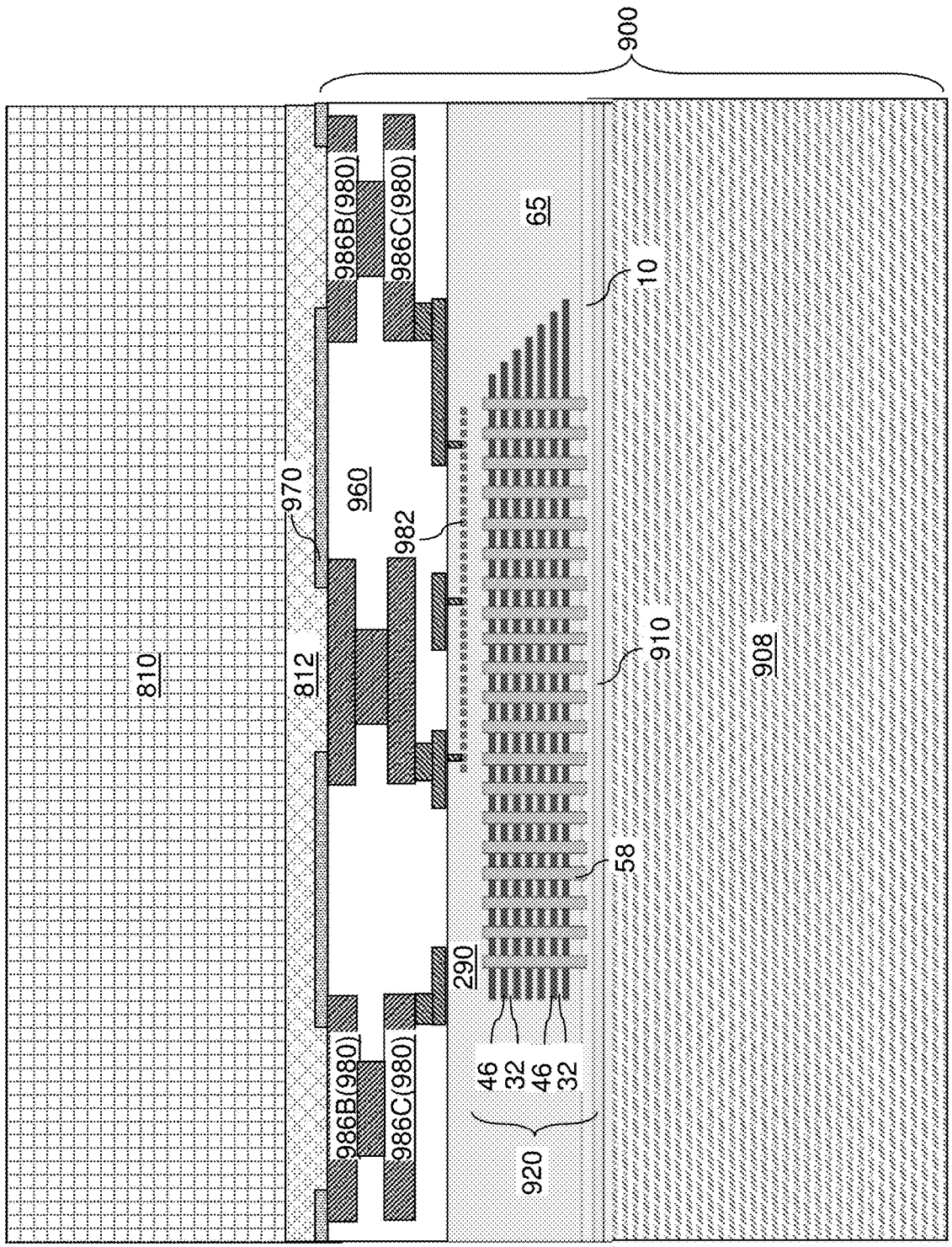
FIG. 2 is a schematic vertical cross-sectional view of the first semiconductor die after attaching a handle substrate on a front side thereof according to the first embodiment of the present disclosure.

Referring to FIG. 2, an adhesive layer 812 can be applied over the top surface of the first semiconductor die 900. The adhesive layer 812 includes a temporary adhesive material that may be deactivated by an anneal at an elevated temperature. For example, the adhesive layer 812 can include an organic polymer material that decomposes in a temperature range from 200 degrees Celsius to 400 degrees Celsius.

A handle substrate 810 can be attached to the adhesive layer 812. The handle substrate 810 can include any material that can adhere to the adhesive layer 812 and can provide mechanical strength to hold the structure above the first substrate 908 during subsequent thinning of the first substrate 908. The handle substrate 810 may include a semiconductor material, an insulating material, or a conductive material. For example, the handle substrate 810 may include a commercially available silicon substrate. The thickness of the handle substrate 810 can be in a range from 200 microns to 10 mm, such as from 600 microns to 3 mm. The lateral extent of the handle substrate 810 may be substantially the same as the lateral extent of the first substrate 908.

Figure 3:
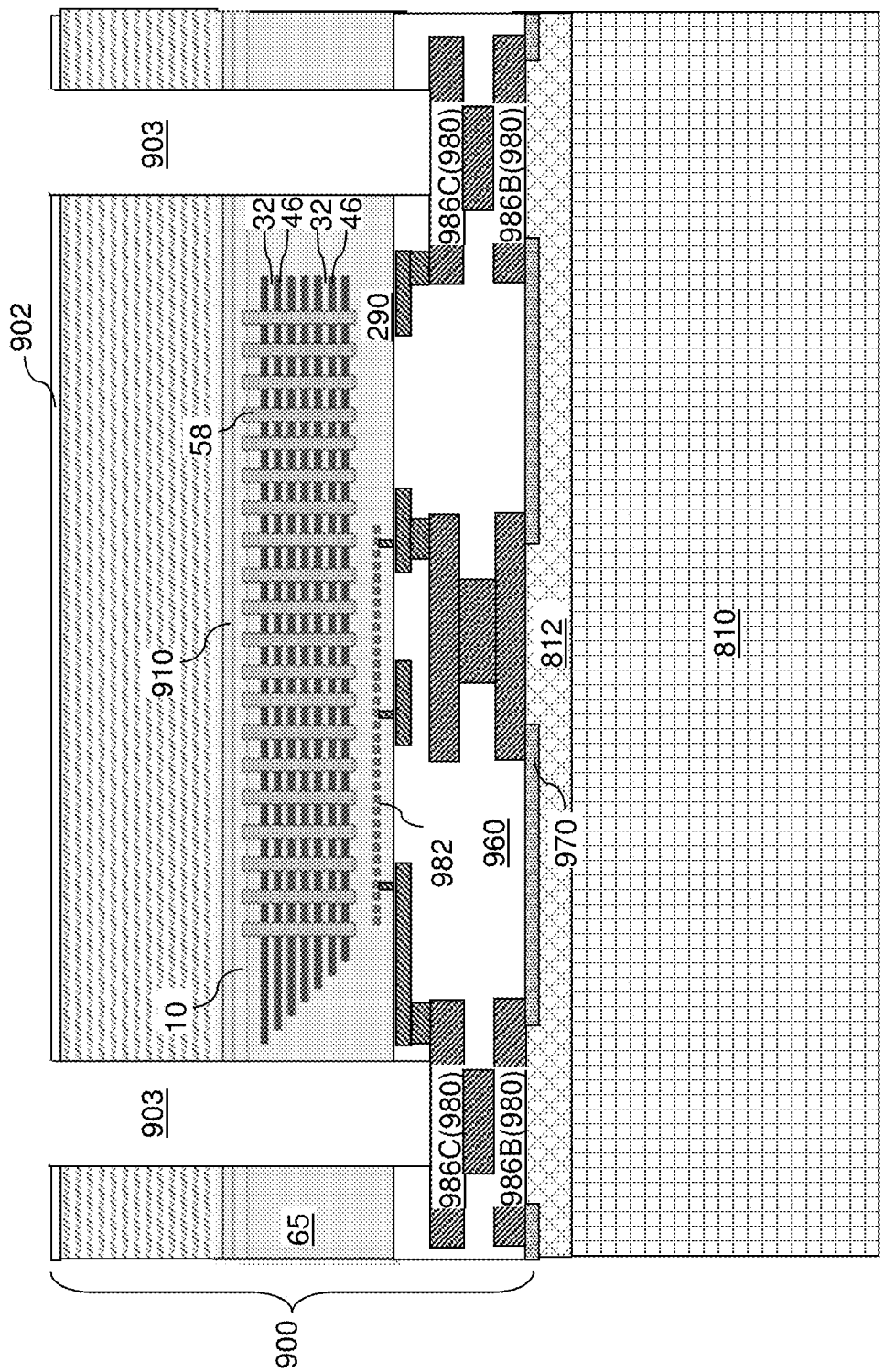
FIG. 3 is a schematic vertical cross-sectional view of the first semiconductor die after formation of a backside insulating layer and first through-substrate via openings according to the first embodiment of the present disclosure.

Referring to FIG. 3, the first substrate 908 can be thinned to a thickness in a range from 3 micron to 30 microns. Grinding, polishing, a wet etch process, and/or a reactive ion etch process may be employed to thin the first substrate 908. An optional first backside insulating layer 902 can be deposited on the backside surface of the thinned first substrate 908, which may have a polished planar backside surface. The first backside insulating layer 902 includes an insulating material such as silicon oxide, silicon nitride, and/or a dielectric metal oxide.

A photoresist layer (not shown) may be applied over the first backside insulating layer 902 while the first exemplary structure is disposed with the handle substrate 810 on the bottom side. The photoresist layer can be lithographically patterned to provide openings in areas that overlie a respective one of the first metal interconnect structures 980. For example, the photoresist layer can be lithographically patterned to provide openings in areas that overlie a respective one of the first contact pad structures 986C.

An anisotropic etch is performed to etch portions of the first backside insulating layer 902, the first substrate 908, and various material portions located between the first substrate 908 and the first contact pad structures 986C. A first through-substrate via opening 903 is formed underneath each opening in the photoresist layer. A proximal horizontal surface (i.e., a surface that is proximal to the substrate 908) of a respective one of the first metal interconnect structures 980 is physically exposed at the bottom of each first through-substrate via opening 903. In one embodiment, a proximal horizontal surface of a respective one of the first contact pad structures 986C is physically exposed at the bottom of each first through-substrate via opening 903. Each first through-substrate via opening 903 can have a circular horizontal cross-sectional shape, an elliptical horizontal cross-sectional shape, a rectangular horizontal cross-sectional shape, or a horizontal cross-sectional shape of any closed curvilinear two-dimensional shape. The maximum lateral dimension of each first through-substrate via opening 903 may be in a range from 1 micron to 60 microns, such as from 3 microns to 20 microns, although lesser and greater dimensions can also be employed. The photoresist layer can be subsequently removed, for example, by ashing.

Figure 4:
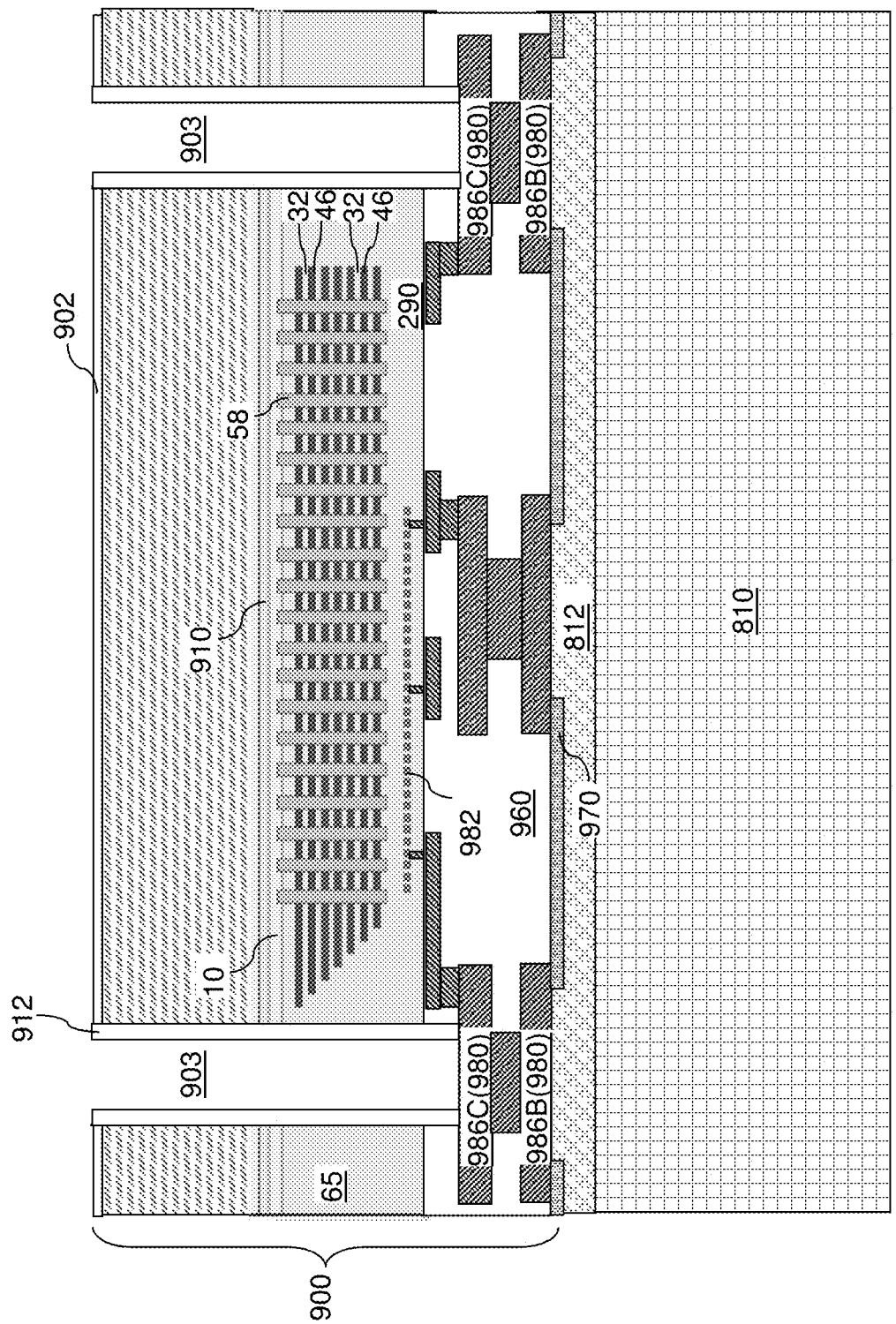
FIG. 4 is a schematic vertical cross-sectional view of the first semiconductor die after formation of cylindrical insulating spacers at peripheral regions of the first through-substrate via openings according to the first embodiment of the present disclosure.

Referring to FIG. 4, an optional insulating material layer can be conformally deposited on the sidewalls and bottom surfaces of the first through-substrate via openings 903 and over the first backside insulating layer 902. The insulating material layer includes an insulating material such as silicon oxide, silicon nitride, and/or a dielectric metal oxide. An anisotropic etch process can be performed to remove horizontal portions of the insulating material layer at the bottom of each first through-substrate via opening 903 and from above the first backside insulating layer 902. Each remaining vertical portion of the insulating material layer is herein referred to as a cylindrical insulating spacer 912. Each optional cylindrical insulating spacer 912 is located at a periphery of a respective one of the first through-substrate via openings 903, and can have a tubular configuration. Each cylindrical spacer 912 can have a generally annular horizontal cross-sectional shape that is invariant with translation along the vertical direction. Each cylindrical spacer 912 can have a lateral thickness (i.e., a lateral distance between an inner sidewall and an outer sidewall) in a range from 50 nm to 1,000 nm, although lesser and greater thicknesses can also be employed. Each cylindrical insulating spacer 912 can vertically extend from the first backside insulating layer 902 to a proximal surface of a respective one of the first metal interconnect structures 980, which may be a proximal surface of a respective one of the first contact pad structures 986C.

Figure 5:
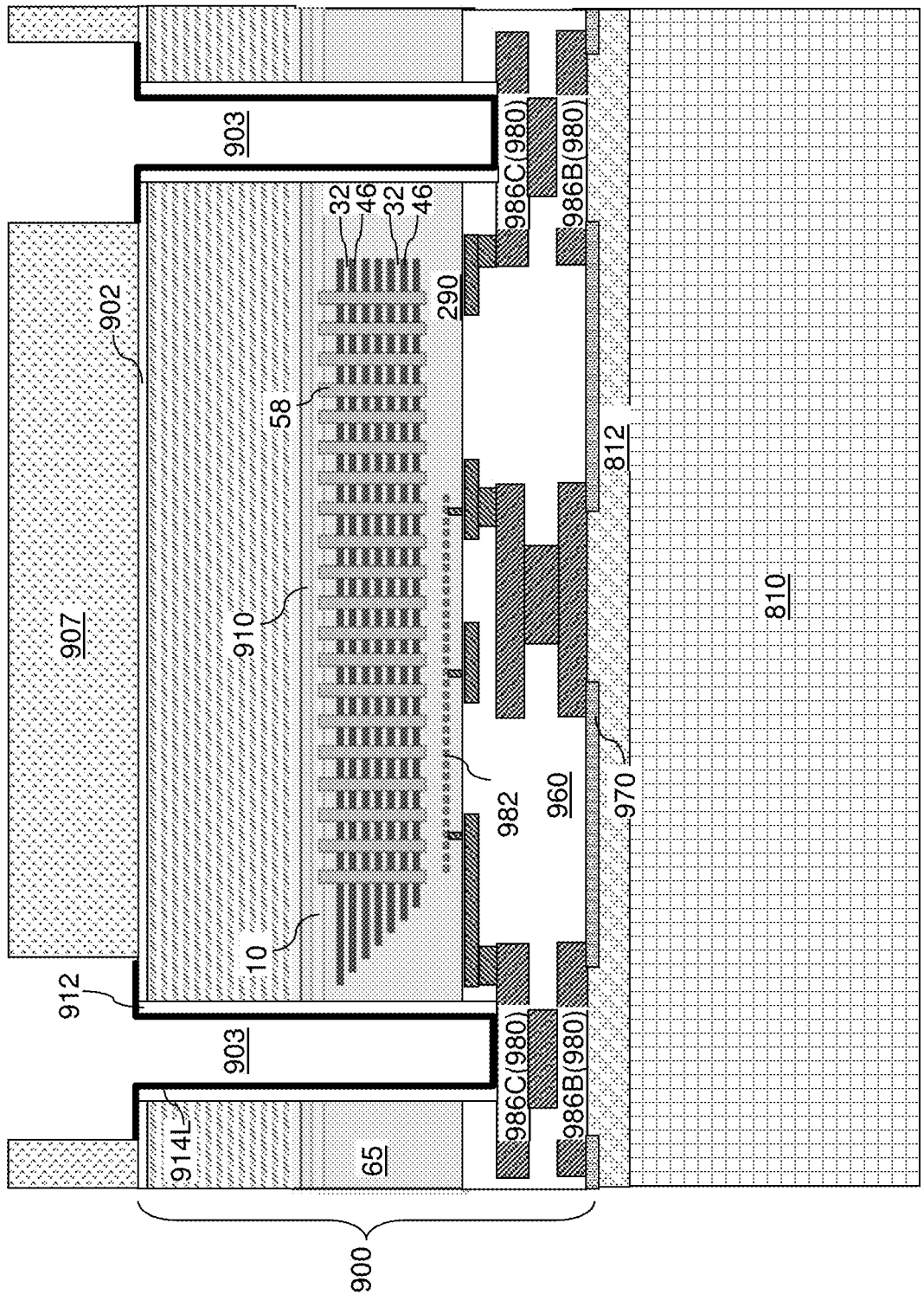
FIG. 5 is a schematic vertical cross-sectional view of the first semiconductor die after formation of a patterned photoresist layer and deposition of a metallic liner according to the first embodiment of the present disclosure.

Referring to FIG. 5, a photoresist layer 907 can be applied over the first backside insulating layer 902, and can be lithographically patterned to cover areas located between the first through-substrate via openings 903. The photoresist layer 907 can be patterned with discrete openings that overlie a respective one of the first through-substrate via openings 903. The area of each opening through the photoresist layer 907 can be selected such that each opening in the photoresist layer 903 has an area of a bonding pad structure to be provided in a second semiconductor die. The area of each opening through the photoresist layer 907 may be circular, elliptical, rectangular, or of any closed two-dimensional curvilinear shape. The maximum lateral dimension of each opening through the photoresist layer 907 may be in a range from 3 microns to 120 microns, such as 6 microns to 60 microns, although lesser and greater dimensions can also be employed. In one embodiment, the geometrical center of each opening in the photoresist layer 907 may coincide with the geometrical center of a respective underlying first through-substrate via opening 903 in a plan view (i.e., a top-down view).

At least one metallic material can be subsequently deposited in the first through-substrate via openings 903. For example, a metallic material can be deposited on physically exposed surfaces of the first metal interconnect structures 980 and over sidewalls of the first through-substrate via openings 903 on inner sidewalls of the cylindrical insulating spacers 912 to form a metallic liner 914L. The metallic liner 914L may be deposited by selective plating (e.g., electroplating or electroless plating) in the openings in the photoresist layer. Alternatively, the metallic liner 914L can be deposited by physical vapor deposition (PVD) (in which case portions of the metallic liner 914L formed in the first through-substrate via openings 903 and on the top surface of the first backside insulating layer 902 are illustrated, while portions of the metallic liner 914L deposited on the photoresist layer 907 are not illustrated for clarity). The metallic liner 914L can include a seed layer, such as nickel, and/or a conductive barrier material such as a conductive metal nitride. Exemplary conductive metal nitride materials that can be employed for the metallic liner 914L include titanium nitride, tantalum nitride, and tungsten nitride. The thickness of each horizontal portion of the metallic liner 914L that is deposited directly on a horizontal surface of a first metal interconnect structure 980 (such as a proximal horizontal surface of a first contact pad structure 986C) can be in a range from 10 nm to 300 nm, although lesser and greater thicknesses can also be employed.

Figure 6:
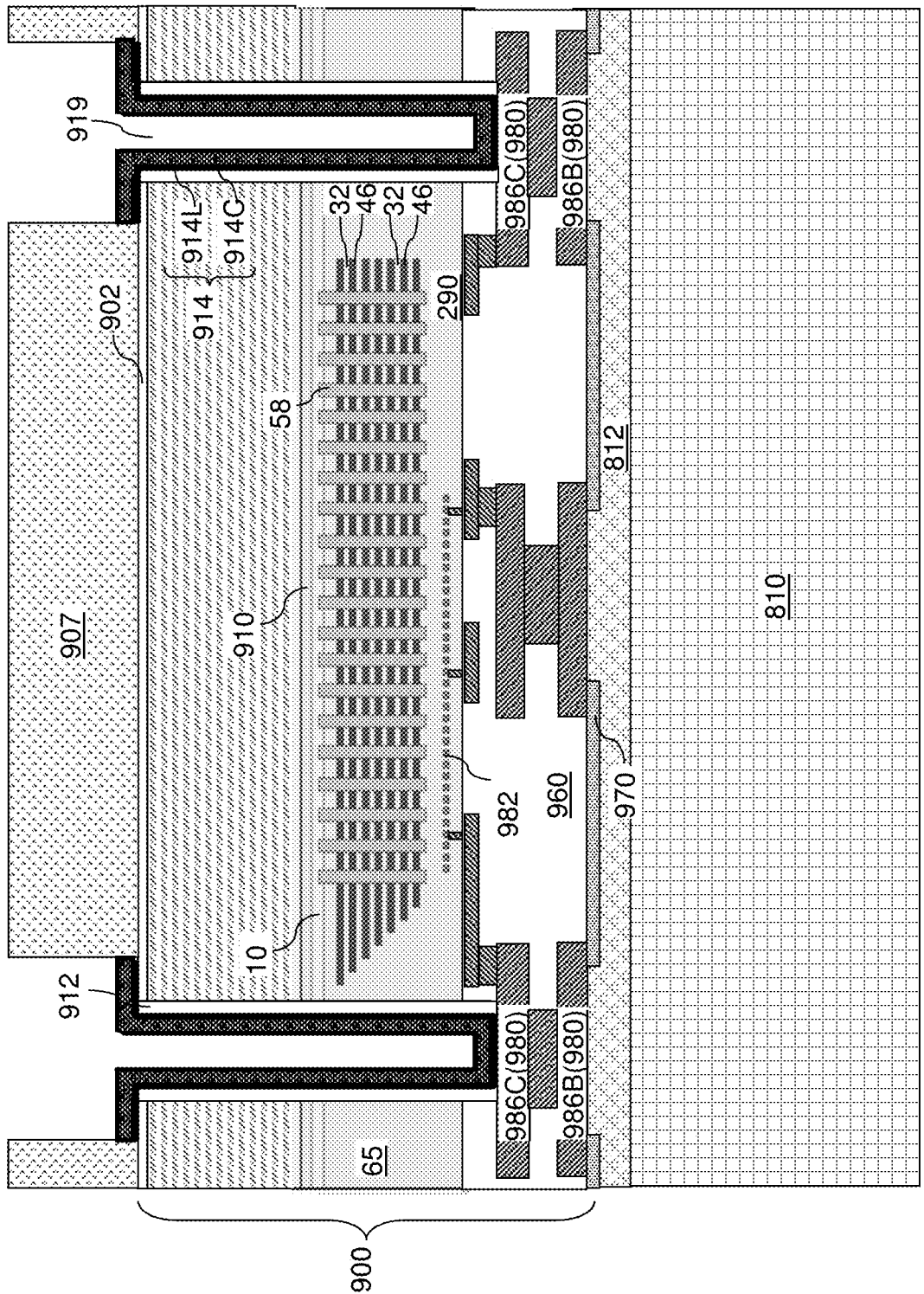
FIG. 6 is a schematic vertical cross-sectional view of the first semiconductor die after formation of first through-substrate via structures according to the first embodiment of the present disclosure.

Referring to FIG. 6, a metal layer 914C can be subsequently deposited over the metallic liner 914L to partially fill the openings 903. In one embodiment, the metal layer 914C can consist essentially of at least one elemental metal such as Cu, W, Ru, Co, and/or Mo. The metal layer 914C can be deposited employing a conformal or non-conformal deposition process. In one embodiment, the metal layer 914C can be deposited by selective plating (e.g., electroplating or electroless plating) on the metallic liner 914L. Alternatively, the metal layer 914C can be deposited by physical vapor deposition (PVD), such as sputtering. The thickness of the metal layer 914C on a horizontal portion of the metallic liner 914L contacting an underlying first metal interconnect structure 980 can be in a range from 30 nm to 600 nm, although lesser and greater thicknesses can also be employed.

A core cavity 919 that is not filled with the at least one metallic material (such as the materials of the metallic liner 914L and the metal layer 914C is provided within each of the first through-substrate via openings 903. Each core cavity 919 is an unfilled volume that is present within a respective first through-substrate via opening 903. Thus, each core cavity 919 extends through a respective opening in a horizontal portion of the metal layer 914C that overlies the first backside insulating layer 902, which overlies a backside surface of the first substrate 908. Each core cavity 919 may remain unfilled (i.e., contain an air gap) in the final assembly or it may be filled with a dielectric fill material portion, such as a polymer, as will be described in more detail below.

Figure 7:
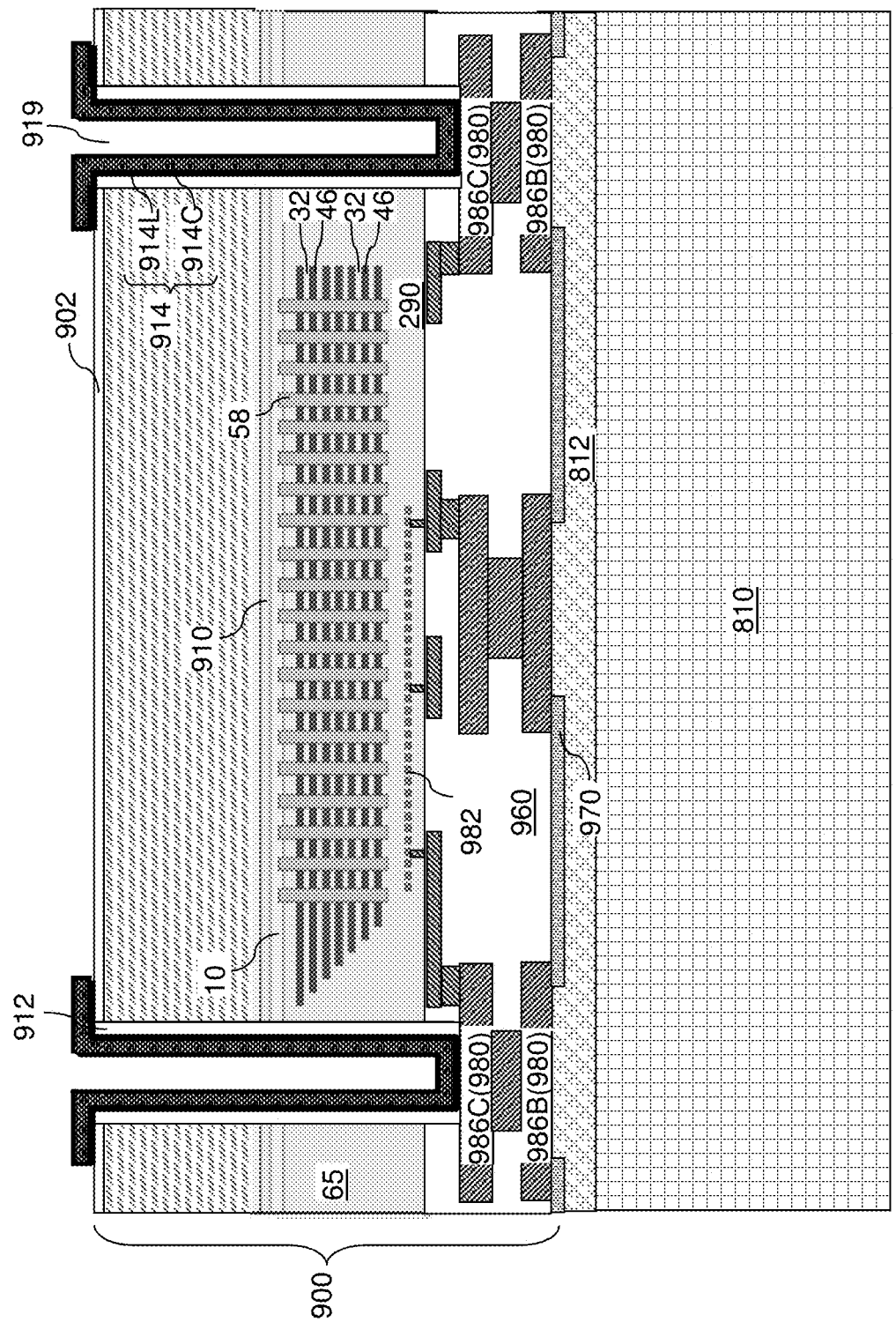
FIG. 7 is a schematic vertical cross-sectional view of the first semiconductor die after attaching a second handle substrate and removing the handle substrate according to the first embodiment of the present disclosure.

Referring to FIG. 7, the photoresist layer 907 and any portions of the metallic liner 914L and the metal layer 914C attached to surfaces of the photoresist layer 907 can be lifted off, for example, employing a solvent. Each contiguous set of a remaining portion of the metallic liner 914L and a remaining portion of the metal layer 914C constitutes a first through-substrate via structure 914. Each horizontal portion of the first through-substrate via structures 914 that overlies the first backside insulating layer 902 can have an outer periphery and an inner periphery that coincides with an upper end of a respective one of the core cavities 919. Generally, each contiguous set of remaining material portions of the at least one metallic material deposited at the processing steps of FIGS. 5 and 6 constitutes a first through-substrate via structure 914. The thicknesses of the deposited material portions of the at least one metallic material can be selected such that a core cavity 919 is present within each first through-substrate via structure 914. Each of the first through-substrate via structures 914 can be formed directly on an inner sidewall of, a respective one of the cylindrical insulating spacers 912. The processing cost and the processing time for formation of the first through-substrate via structures 914 is reduced by reducing the thickness of the at least one metallic material and by not filling the entire volume of each first through-substrate via opening 903. Furthermore, any metal overburden (e.g., any remaining metal layer 914C, such as copper) is avoided or removed by removing (i.e., stripping) the photoresist layer 907.

Figure 8:
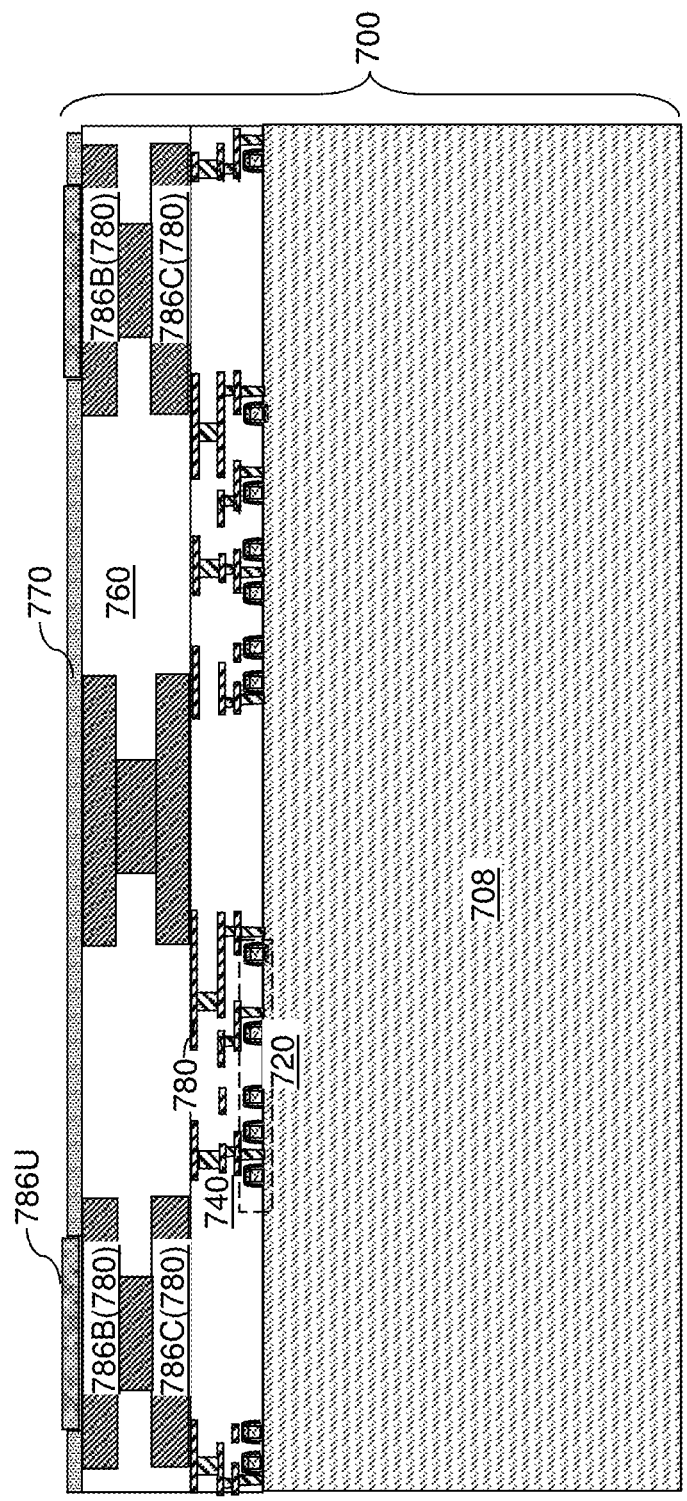
FIG. 8 is a schematic vertical cross-sectional view of a second semiconductor die after formation of second bonding pad structures according to the first embodiment of the present disclosure.

Referring to FIG. 8, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include at least one complementary metal oxide semiconductor (CMOS) circuitry including field effect transistors. In one embodiment, the second substrate 708 may be a commercially available silicon wafer having a thickness in a range from 500 microns to 1 mm.

Generally, the second semiconductor devices can comprise any semiconductor device that can be operated in conjunction with the first semiconductor devices 920 in the first semiconductor die 900 to provide enhanced functionality. In one embodiment, the first semiconductor die 900 comprises a memory die and the second semiconductor die 700 comprises a logic die that includes a peripheral circuitry configured to control operation of the first semiconductor devices 920 which comprise a three-dimensional array of memory elements (e.g., vertical NAND strings) located within the first semiconductor die 900. In one embodiment, the first semiconductor die 900 can include a three-dimensional memory device including a three-dimensional array of memory elements, word lines (i.e., the electrically conductive layers 46), and bit lines 982, the second semiconductor devices 720 of the second semiconductor die 700 can include a peripheral circuitry for operation of the three-dimensional array of memory elements. The peripheral circuitry may include a word line driver that drives word lines of the three-dimensional array of memory elements within the first semiconductor die 900, a bit line driver that drives the bit lines 982 in the first semiconductor die 900, a word line decoder circuit that decodes the addresses for the electrically conductive layers 46, a bit line decoder circuit that decodes the addresses for the bit lines 982, a sense amplifier circuit that senses the states of memory elements within the memory opening fill structures 58 in the first semiconductor die 900, a source power supply circuit that provides power to the horizontal semiconductor channel layer 10 in the first semiconductor die 900, a data buffer and/or latch, or any other semiconductor circuit that may be used to operate three-dimensional array of memory elements in the first semiconductor die 900.

The second dielectric material layers (740, 760, 770) can include proximal interconnect-level dielectric layers 740 embedding a proximal subset of the second metal interconnect structures 780 that is proximal to the second substrate 708, distal interconnect-level dielectric layers 760 embedding a distal subset of second metal interconnect structures 780 that is distal from the second substrate 708, and a second bonding-level dielectric layer 770 that is formed above the distal interconnect-level dielectric layers 760. The second metal interconnect structures 780 include second contact pad structures 786C that are located within an upper portion of the distal interconnect-level dielectric layers 760 and second bonding pad structures 786B that are located within a lower portion of the second bonding-level dielectric layer 770. In one embodiment, each of the second bonding pad structures 786B can optionally include an underbump metal stack 786U at an upper portion thereof. The second contact pad structures 786C and the second bonding pad structures 786B are collectively referred to as second metallic pad structures (786C, 786B).

The proximal interconnect-level dielectric layers 740 and the distal interconnect-level dielectric layers 760 can include a dielectric material such as undoped silicate glass, a doped silicate glass, organosilicate glass, silicon nitride, a dielectric metal oxide, or a combination thereof. The second bonding-level dielectric layer 770 includes a silicon oxide material such as undoped silicate glass or a doped silicate glass. The thickness of the second bonding-level dielectric layer 770 can be in a range from 100 nm to 3,000 nm, although lesser and greater thicknesses can also be employed. The second bonding-level dielectric layer 770 can have a planar top surface, which can be provided, for example, by a planarization process such as a chemical mechanical polishing (CMP) process. Openings may be formed through the second bonding-level dielectric layer 770 such that the top surfaces of the second bonding pad structures 786B are be physically exposed in the openings through the second bonding-level dielectric layer 770. Alternatively, the openings through the second bonding-level dielectric layer 770 may be formed at a subsequently processing step after formation of second through-substrate via structures. If the die 700 is intended to be the topmost or bottom most die in the bonded die assembly, then the fabrication of die 700 is completed at this point.

Figure 9:
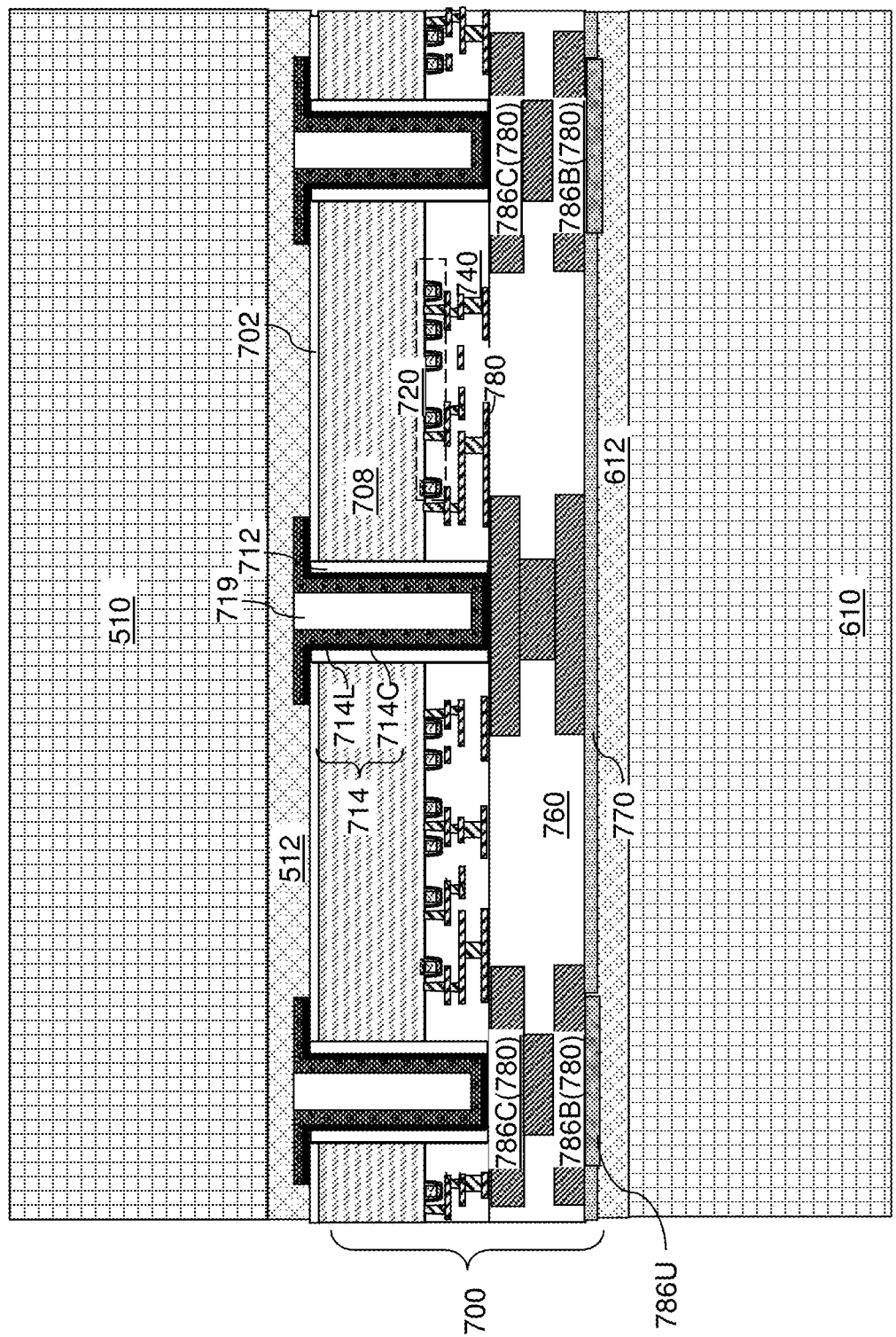
FIG. 9 is a schematic vertical cross-sectional view of the second semiconductor die after attaching a front-side handle substrate, forming second through-substrate via structures, and attaching a backside handle substrate according to the first embodiment of the present disclosure.

Alternatively, if die 700 is intended to be located in the middle of the bonded die assembly or if it is desired to make electrical contacts through the second substrate 708, then additional processing steps shown in FIG. 9 are performed. Referring to FIG. 9, the processing steps of FIGS. 2-7 can be performed (with the respective differences having been considered) on the second semiconductor die 700. For example, a front-side handle substrate 610 can be attached to the front side (i.e., the side with the second bonding-level dielectric layer 770) of the second semiconductor die 700 through a front-side adhesive layer 612. The second substrate 708 can be thinned, and an optional second backside insulating layer 702 can be formed on the backside surface of the thinned second substrate 708, and second through-substrate via openings can be formed through the second backside insulating layer 702, the thinned second substrate 708, and underlying material portions such that a proximal surface of a respective second metal interconnect structure 780 (such as a respective second contact pad structure 786C) is physically exposed at the bottom of each second through-substrate via opening. Second through-substrate via structures 714 can be formed by performing a same set of processing steps employed to form the first through-substrate via structures 914. Each second through-substrate via structure 714 can include a metallic liner 714L and a metal layer 714C.

A core cavity 719 that is not filled with the at least one metallic material (such as the materials of the metallic liner 714L and the metal layer 714C,) is provided within each of the second through-substrate via openings. Each core cavity 719 is an unfilled volume (e.g., air gap) or a dielectric filled volume (e.g., polymer filled volume) that is present within a respective second through-substrate via opening. Each horizontal portion of the second through-substrate via structures 714 that overlies the second backside insulating layer 702 can have an outer periphery and an inner periphery that coincides with an upper end of a respective one of the core cavities 719. Thus, each core cavity 719 extends through a respective opening in a horizontal portion of the metal layer 714C that overlies the second backside insulating layer 702, which overlies a backside surface of the second substrate 708.

A backside adhesive layer 512 can be applied to the second backside insulating layer 702, and an optional backside handle substrate 510 can be attached to the backside adhesive layer 512. The backside adhesive layer 512 can include any material that can be employed for the adhesive layer 812. The backside handle substrate 510 can include any material that can adhere to the backside adhesive layer 512 and can provide mechanical strength to hold the structure underneath during a subsequent bonding process. Alternatively, the processing steps of FIG. 9 can be performed without attaching a backside handle substrate.

Figure 10A:
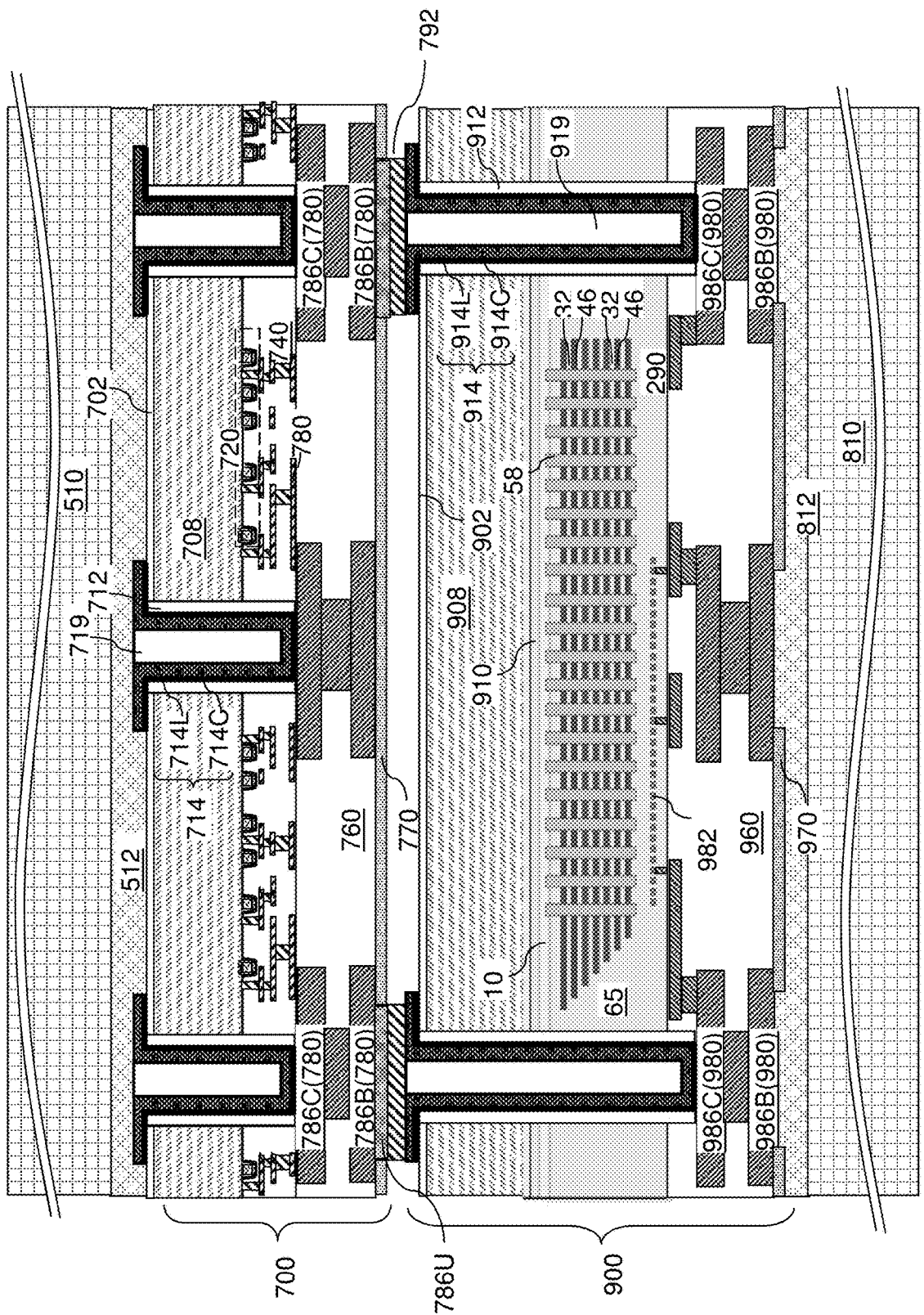
FIG. 10A is schematic vertical cross-sectional view of a first exemplary structure including a bonded assembly of the first semiconductor die and the second semiconductor die according to the first embodiment of the present disclosure.

Referring to FIG. 10A, the front-side handle substrate 610 and the front-side adhesive layer 612 can be removed, for example, by thermal treatment and/or treatment with a solvent. Solder material portions 792 (e.g., solder bumps) can be formed on each physically exposed second bonding pad structure 786B. Each of the second bonding pad structures 786B can include an underbump metal stack 786U at a physically exposed portion thereof, and the solder material portions 792 can be attached to the underbump metal stack of a respective one of the second bonding pad structures 786B.

The assembly of the second semiconductor die 700 and the first semiconductor die 900 can be positioned such that the solder material portions 792 face a respective one of the first through-substrate via structures 914. The solder material portions 792 are brought into contact with a respective one of the first through-substrate contact structures 914. The solder material portions 792 can be reflowed by performing an anneal process, and the first semiconductor die 900 can be bonded to the second semiconductor die 700 through an array of the reflowed and re-solidified solder material portions 792. Each solder material portion 792 can be bonded to a pair of a first through-substrate via structure 914 and a second bonding pad structures 786B. In one embodiment, the second semiconductor die 700 may be positioned below the first semiconductor die 900 in order to prevent reflow of the solder material portions 792 into the core cavities 919 within the first semiconductor die 900.

Figure 10B:
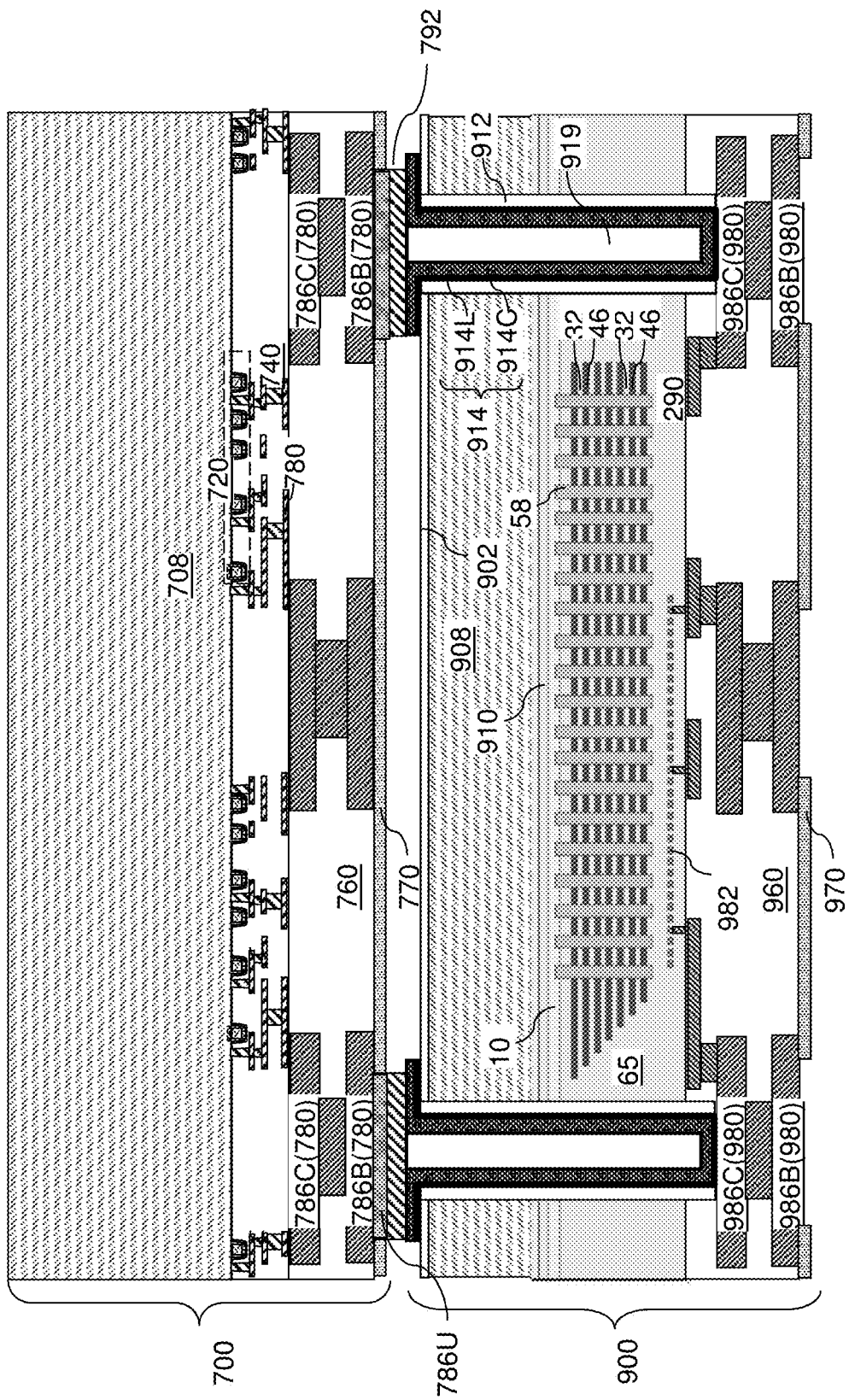
FIG. 10B is schematic vertical cross-sectional view of an alternative configuration of the first exemplary structure of FIG. 10A.
Figure 11A:
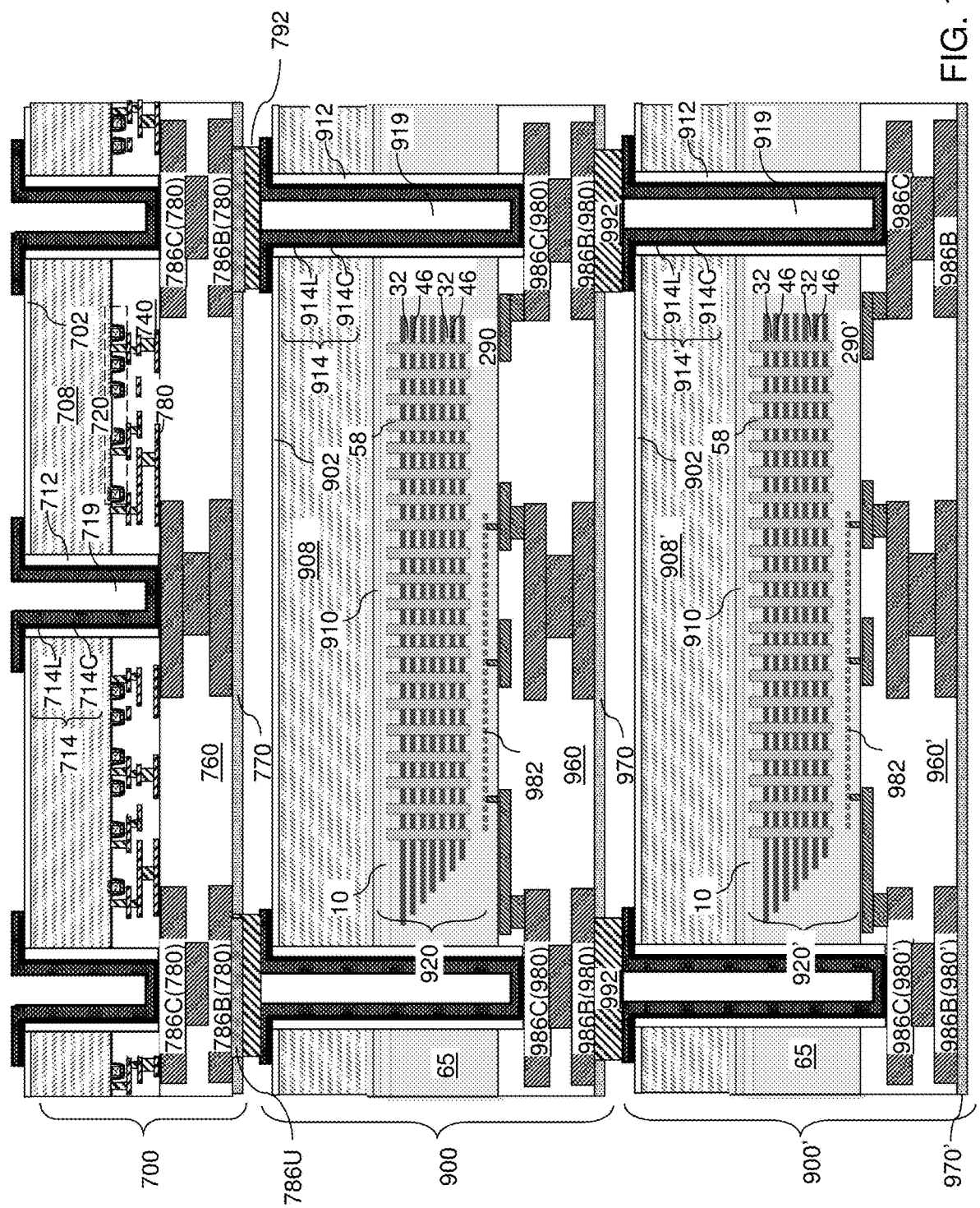
FIG. 11A is a schematic vertical cross-sectional view of a first exemplary structure including a bonded assembly of the first semiconductor die, the second semiconductor die, and a third semiconductor die according to the first embodiment of the present disclosure.

Alternatively, if the steps shown in FIG. 9 are not performed, then the second semiconductor die 700 shown in FIG. 8 is bonded to the first semiconductor die 900 as shown in FIG. 10B. In this embodiment, the second through-substrate contact structures 714 are omitted from the bonded assembly. The handle substrate 810, the adhesive layer 812, the handle substrate 510 (if present) and the adhesive layer 5123 (if present) can be removed, for example, by thermal treatment and/or treatment with a solvent, as shown in FIGS. 10B and 11A.

Generally, the second bonding pad structures 786B are bonded to a respective one of the first through-substrate via structures 914 through a respective solder material portion 792. The second bonding pad structures 786B are bonded to the respective one of the first through-substrate via structures 914 while a void is present within each core cavity 919. Each core cavity 919 includes a void after bonding the second bonding pad structures 786B to the respective one of the first through-substrate via structures 914. In one embodiment, the structures shown in FIGS. 10A and 10B may comprise a completed bonded assembly.

In another embodiment, additional semiconductor die are added to the bonded assembly. As shown in FIG. 11A, a third semiconductor die 900' may be bonded to the top side of the first semiconductor die 900 (e.g., the side distal from the first semiconductor substrate 908 of the first semiconductor die 900). The third semiconductor die 900' can include a same set of components as the first semiconductor die 900 with modifications to the semiconductor devices 920 (which are herein referred to as third semiconductor devices) and metal interconnect structures (which are herein referred to as third metal interconnect structures) therein.

Solder material portions 992 can be formed on each physically exposed first bonding pad structure 986B of the first semiconductor die 900. Each of the first bonding pad structures 986B can include an underbump metal stack at a physically exposed portion thereof, and the solder material portions 992 can be attached to the underbump metal stack of a respective one of the first bonding pad structures 986B. The solder material portions 992 applied to the first bonding pad structures 986B may have a lower reflow temperature than the solder material portions 792 that provide bonding between the first semiconductor die 900 and the second semiconductor die 700.

The bonded assembly of the first semiconductor die 900, the second semiconductor die 700, and third semiconductor die 900' can be positioned such that the solder material portions 992 face a respective one of the third through-substrate via structures 914 of the third semiconductor die 900'. The solder material portions 992 can be reflowed by performing an anneal process, and the first semiconductor die 900 can be bonded to the third semiconductor die 900' through an array of the reflowed and re-solidified solder material portions 992. The anneal temperature may be at, or above, the reflow temperature of the solder material portions 992 and may be lower than the reflow temperature of the solder material portions 792 that provides bonding between the first semiconductor die 900 and the second semiconductor die 700 so that reflow of the solder material portions 792 between the first semiconductor die 900 and the second semiconductor die 700 can be avoided.

Generally, the first bonding pad structures 986B can be bonded to a respective one of the third through-substrate via structures 914 of the third semiconductor die 900' through a respective solder material portion 992. The first bonding pad structures 986B are bonded to the respective one of the third through-substrate via structures 914 while a void (e.g., air gap) or a dielectric material is present within each core cavity 919 in the third semiconductor die 900'.

Figure 11B:
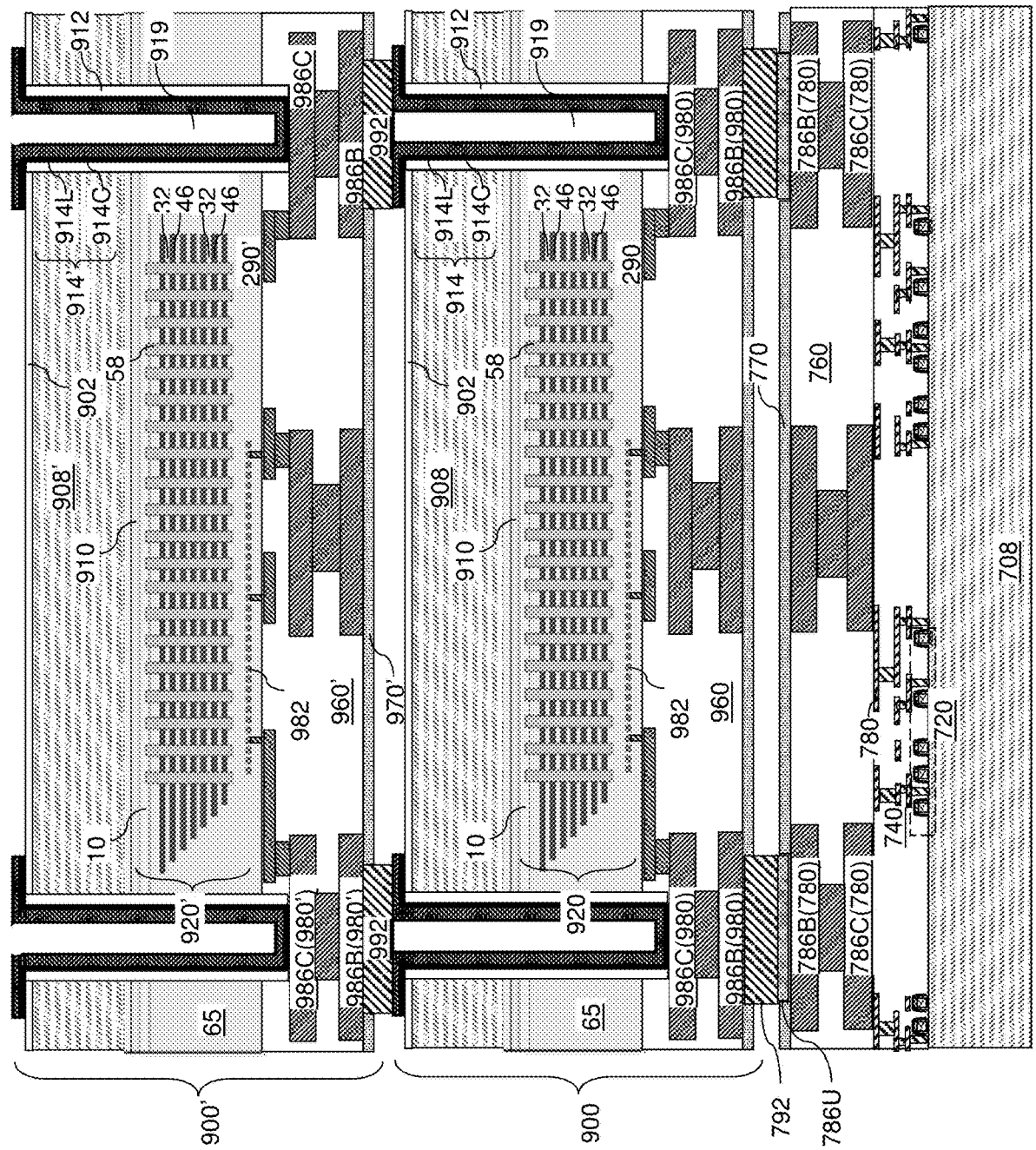
FIG. 11B is schematic vertical cross-sectional view of an alternative configuration of the first exemplary structure of FIG. 11A.

Referring to FIG. 11B, an alternative configuration of the bonded assembly is illustrated. In the embodiment of FIG. 11B, the second semiconductor die 700 is bonded to the top side (i.e., the side distal from the first semiconductor substrate 908) of the first semiconductor die 900. For example, the second bonding pad structures 786B of the second semiconductor die 700 may be bonded to the first bonding pad structures 986B of the first semiconductor die 900 using the underbump metal stack 986U and the solder material portions 792 described above. The third semiconductor die 900' is bonded to the bottom side (i.e., the side proximal to the first semiconductor substrate 908) of the first semiconductor die 900 as using the steps described above. Specifically, the third bonding pad structures 986B of the third semiconductor die 900' are bonded to a respective one of the first through-substrate via structures 914 of the first semiconductor die 900 through a respective solder material portion 992.

Figure 12:
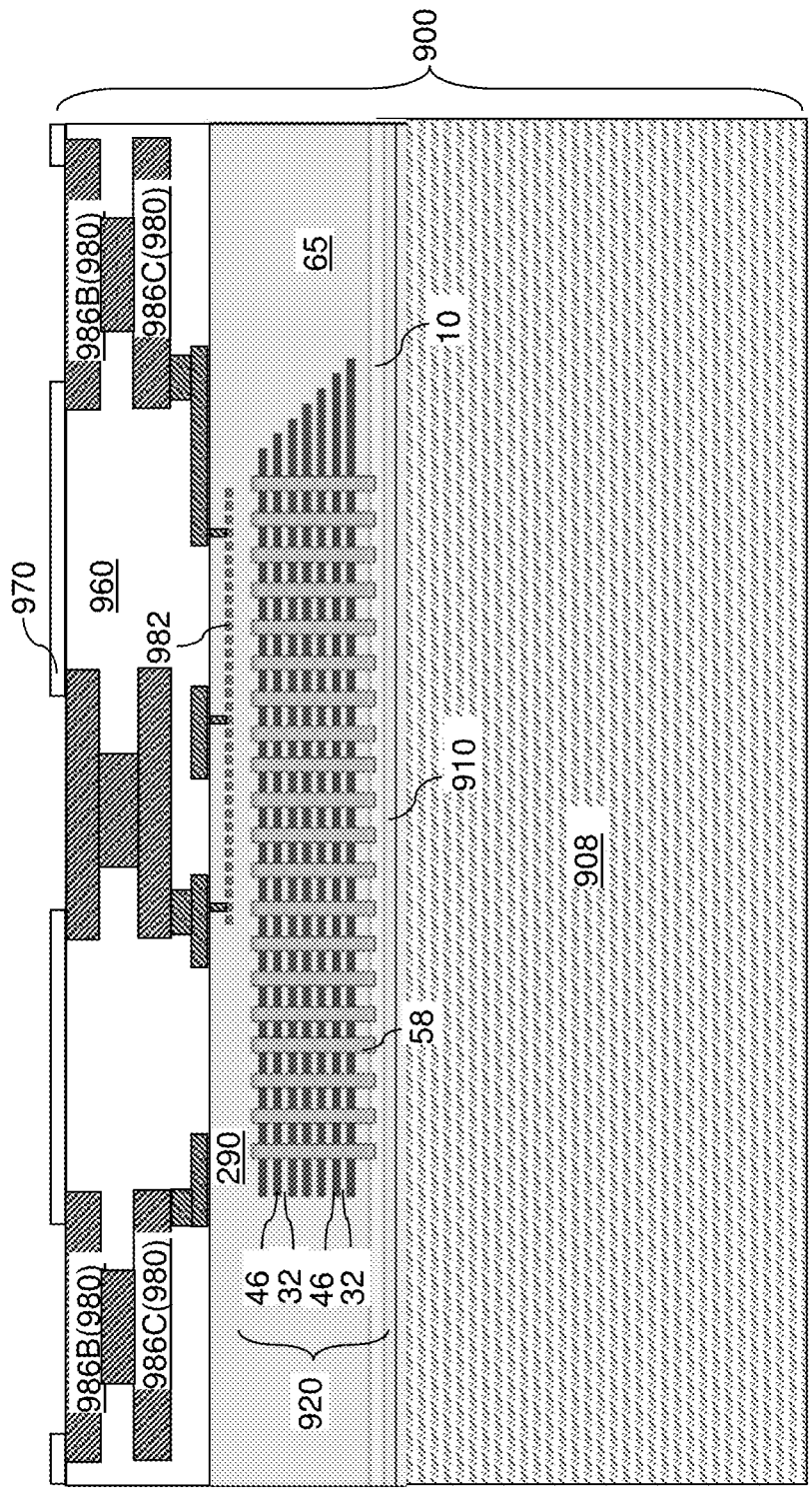
FIG. 12 is a schematic vertical cross-sectional view of a first semiconductor die after formation of first bonding pad structures according to a second embodiment of the present disclosure.

Referring to FIG. 12, a first semiconductor die 900 according to a second embodiment of the present disclosure is illustrated, which can be derived from the first semiconductor die 900 of FIG. 1 by modifying the first bonding pad structures 986B. Specifically, the first bonding pad structures 986B can be configured for hybrid bonding rather than solder bump bonding. The hybrid bonding may include direct metal-to-metal and dielectric-to-dielectric bonding without using the solder bumps. In this case, the first bonding pad structures 986B do not contain an underbump metal stack. The entirety of the physically exposed surfaces of the first bonding pad structures 986B can be a metal surface that can be employed for the metal-to-metal direct bonding. For example, the physically exposed surfaces of the first bonding pad structures 986B can be copper surfaces. Furthermore, the first bonding-level dielectric layer 970 may contain a planar top surface suitable for bonding to other bonding dielectrics.

Figure 13:
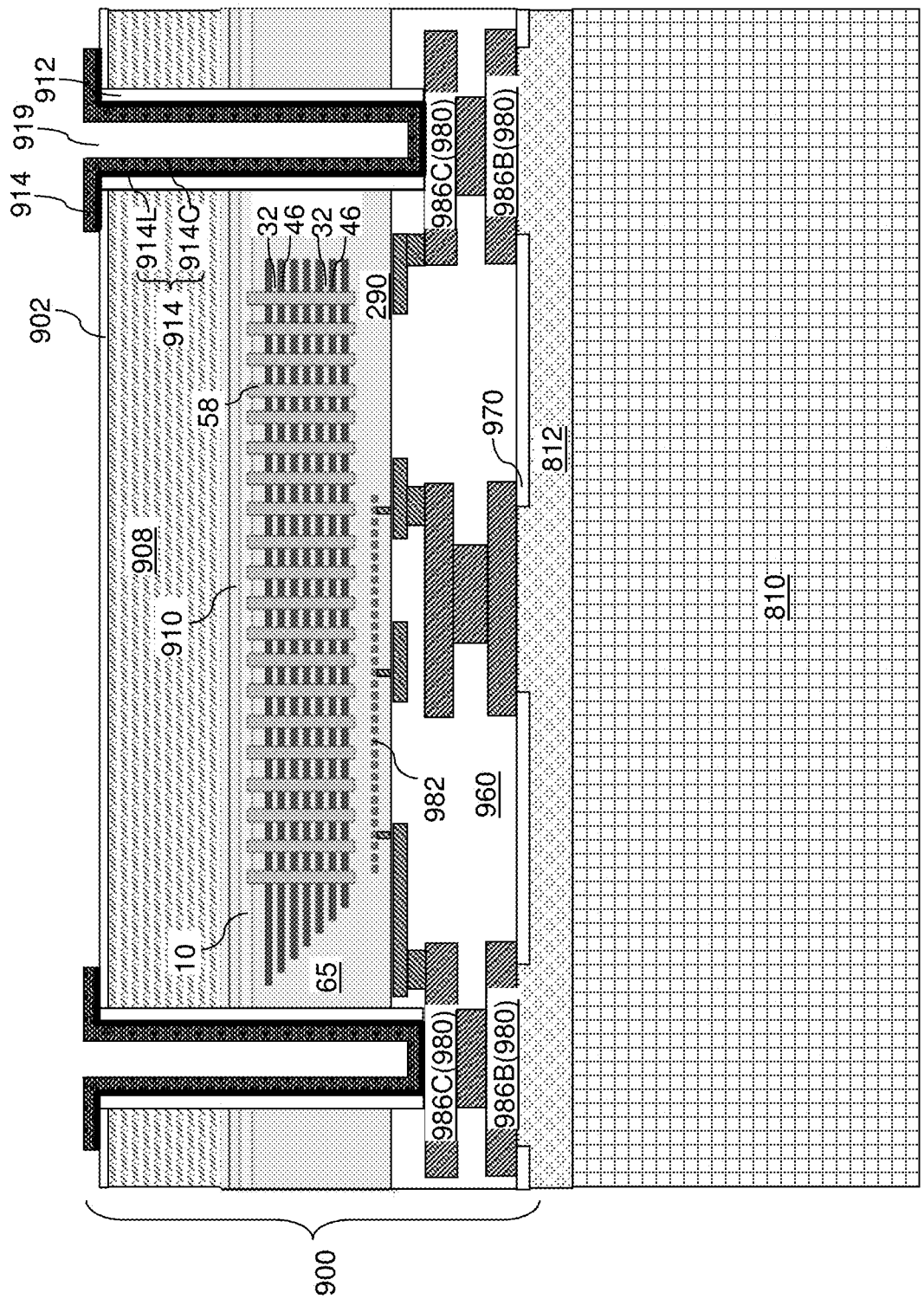
FIG. 13 is a schematic vertical cross-sectional view of the first semiconductor die after formation of first through-substrate via structures according to the second embodiment of the present disclosure.

Referring to FIG. 13, the processing steps of FIGS. 2-7 can be performed with a modification to the composition of the at least one metallic material employed to form the first through-substrate via structure 914. Specifically, the composition of the metal layer 914C can be selected to enable metal-to-metal direct bonding. For example, the metal layer 914C can consist essentially of copper.

Figure 14:
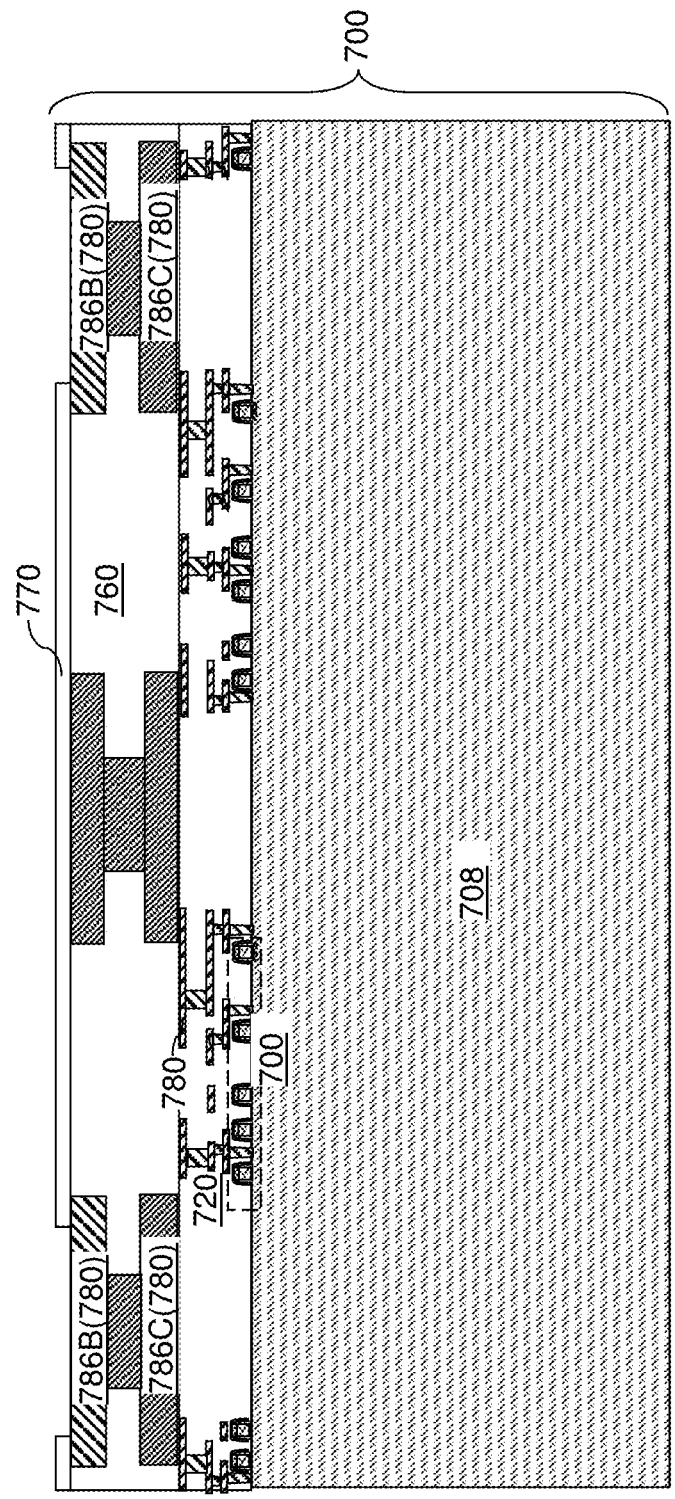
FIG. 14 is a schematic vertical cross-sectional view of a second semiconductor die after formation of second bonding pad structures according to the second embodiment of the present disclosure.

Referring to FIG. 14, a second semiconductor die 700 according to the second embodiment of the present disclosure is illustrated, which can be derived from the second semiconductor die 700 of FIG. 8 by modifying the second bonding pad structures 786B. Specifically, the second bonding pad structures 786B can be configured for direct metal-to-metal bonding. In this case, the second bonding pad structures 786B do not contain an underbump metal stack. The entirety of the physically exposed surfaces of the second bonding pad structures 786B can be a metal surface that can be employed for a metal-to-metal direct bonding. For example, the physically exposed surfaces of the second bonding pad structures 786B can be copper surfaces. Furthermore, the second bonding-level dielectric layer 770 may contain a planar top surface suitable for bonding to other bonding dielectrics.

Figure 15:
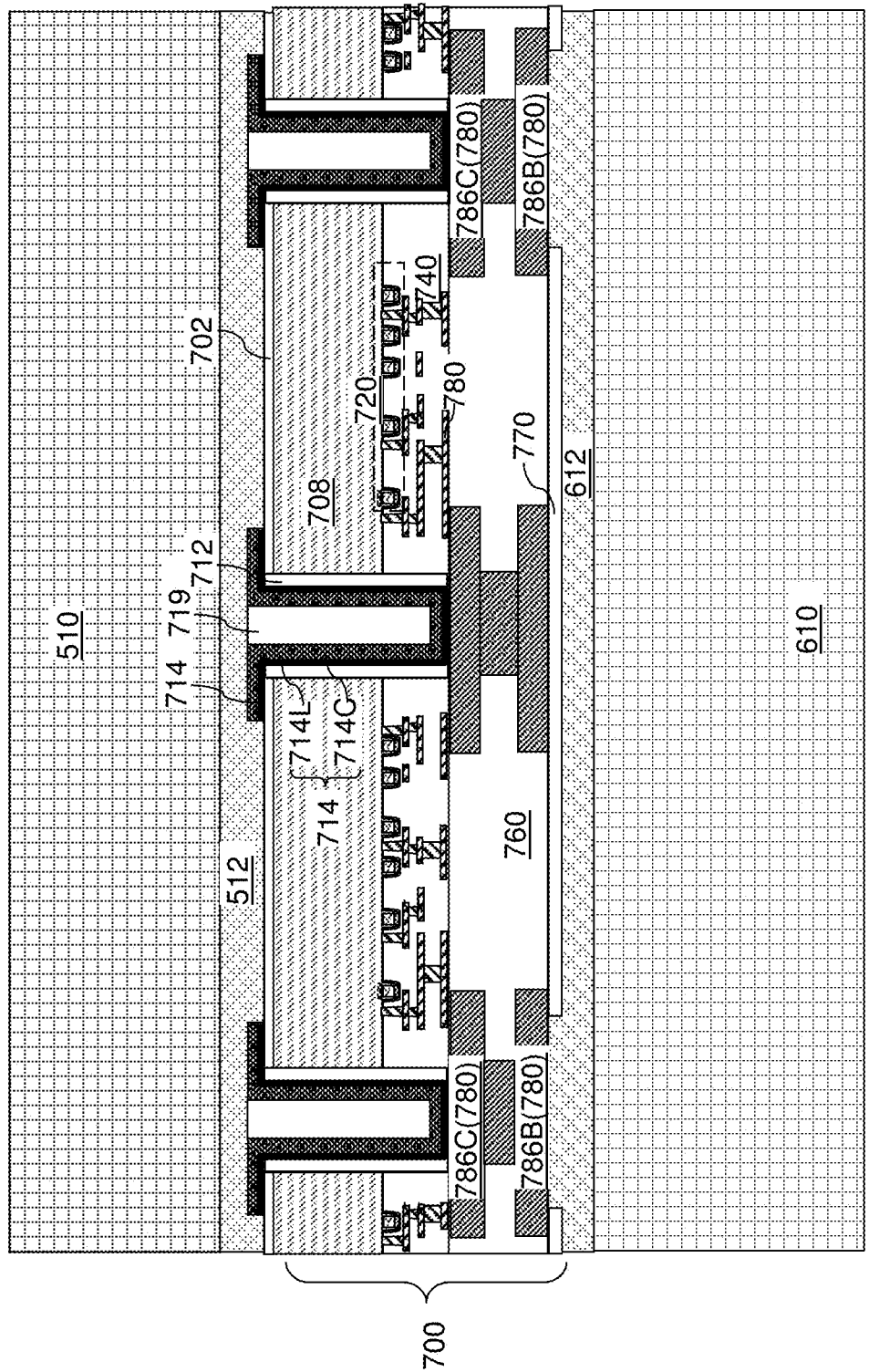
FIG. 15 is a schematic vertical cross-sectional view of the second semiconductor die after attaching a front-side handle substrate, forming second through-substrate via structures, and attaching a backside handle substrate according to the second embodiment of the present disclosure.

Referring to FIG. 15, the processing steps of FIG. 9 may be optionally performed with a modification that the deposition of the underbump metal stack 986U is omitted. Further, the composition of the metal layer 714C can be selected to enable metal-to-metal direct bonding. For example, the metal layer 714C can consist essentially of copper.

Figure 16:
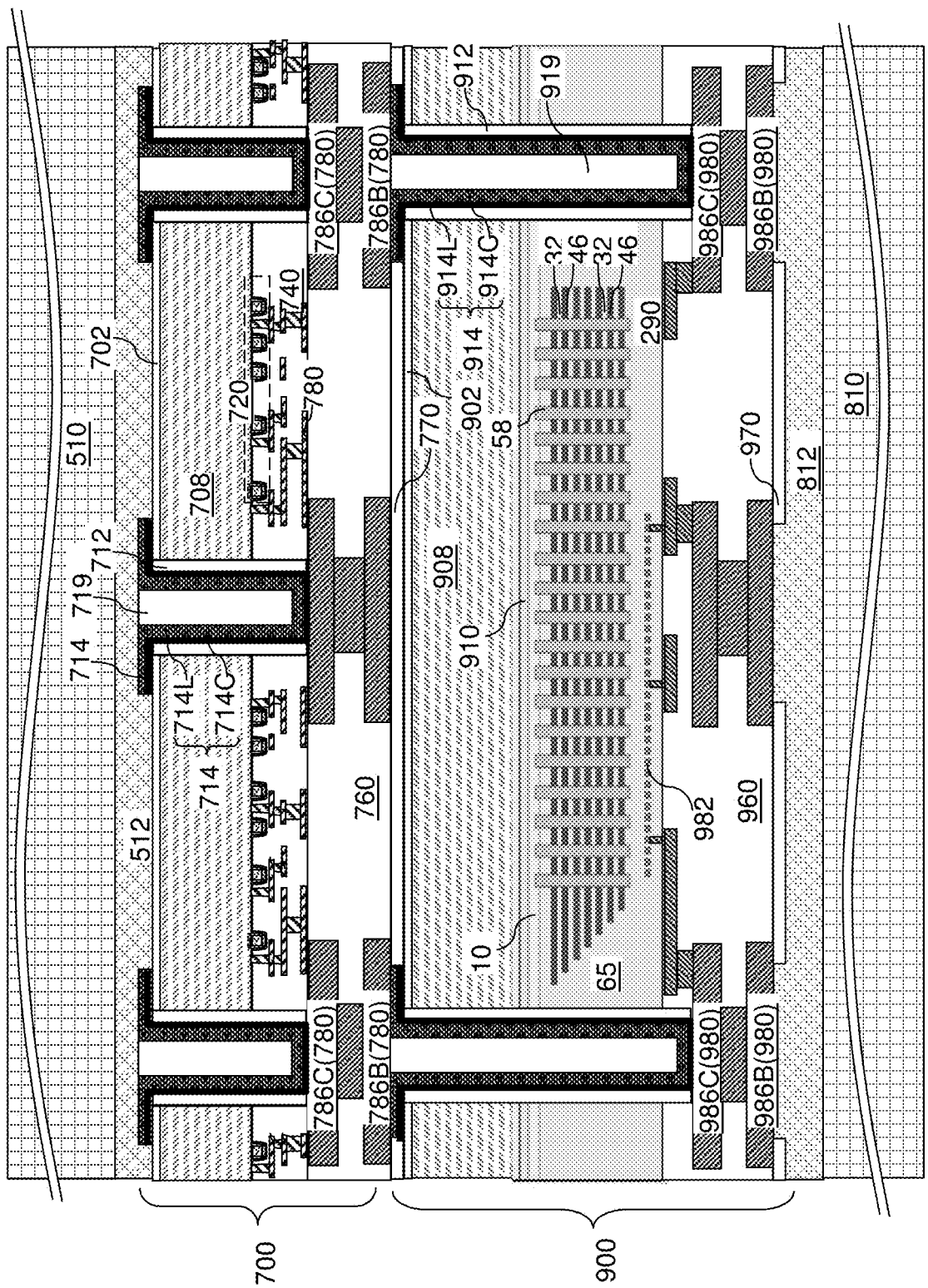
FIG. 16 is a first exemplary structure including a bonded assembly of the first semiconductor die and the second semiconductor die according to the second embodiment of the present disclosure.

Referring to FIG. 16, the front-side handle substrate 610 and the front-side adhesive layer 612 can be removed, for example, by thermal treatment and/or treatment with a solvent. The assembly of the second semiconductor die 700 and the first semiconductor die 900 can be positioned such that the second bonding pad structures 786B face a respective one of the first through-substrate via structures 914. The second bonding pad structures 786B are brought into contact with a respective one of the first through-substrate contact structures 914. An anneal process can be performed to induce metal-to-metal bonding (such as copper-to-copper bonding) between each mating pair of a second bonding pad structure 786B and a first through-substrate via structure 914. In addition, the first backside insulating layer 902 may be bonded to the second bonding-level insulating layer 770. If both of the first backside insulating layer 902 and the second bonding-level insulating layer 770 include silicon oxide, the first backside insulating layer 902 can be bonded to the second bonding-level insulating layer 770 through oxide-to-oxide bonding.

Generally, the second bonding pad structures 786B may be directly bonded to a respective one of the first through-substrate via structures 914. The second bonding pad structures 786B are bonded to the respective one of the first through-substrate via structures 914 while a void (e.g., air gap) or a dielectric fill material is present within each core cavity 919.

Figure 17:
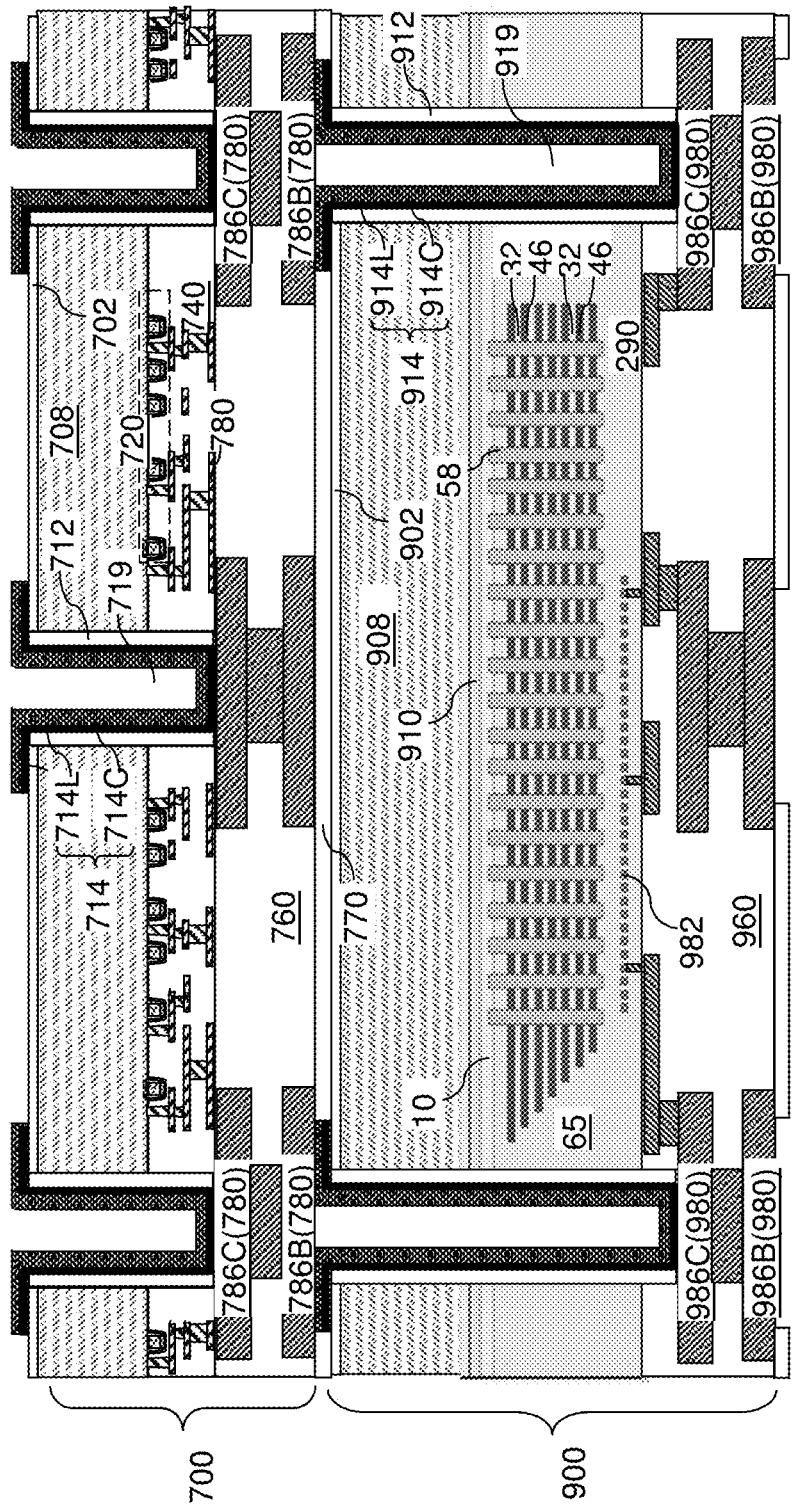
FIG. 17 is a first exemplary structure including a bonded assembly of the first semiconductor die, the second semiconductor die, and a third semiconductor die according to the second embodiment of the present disclosure.

Referring to FIG. 17, the handle substrates 810, 510 and the adhesive layers 812, 512 can be removed, for example, by thermal treatment and/or treatment with a solvent. In one configuration of the second embodiment shown in FIG. 17, the top side of the second semiconductor die 700 is bonded to the bottom side of the first semiconductor die 900 using the hybrid bonding method, to provide a bonded assembly having a configuration similar to that of FIG. 10A.

Alternatively, in another configuration of the second embodiment, the hybrid bonding method may be used to bond the top of the second semiconductor die 700 to the top of the first semiconductor die 900, without using the solder material portions 752 to provide a bonded assembly having a configuration similar to that of FIG. 10B.

In other alternative configurations of the second embodiment, the hybrid bonding method may be used to bond the third semiconductor die 900' to the top or bottom of the first semiconductor die 900 to provide a bonded assembly having a configuration similar to that of FIGS. 11A and 11B respectively. In this alternative configurations, the bonded assembly contains at least three semiconductor die (900, 700, 900') without using the solder material portions (752, 952). If desired, four or more die may be bonded using the solder bump bonding or the hybrid bonding methods by bonding a fourth semiconductor die to the bonding assembly using the steps shown in FIG. 11A or 11B.

Figure 18:
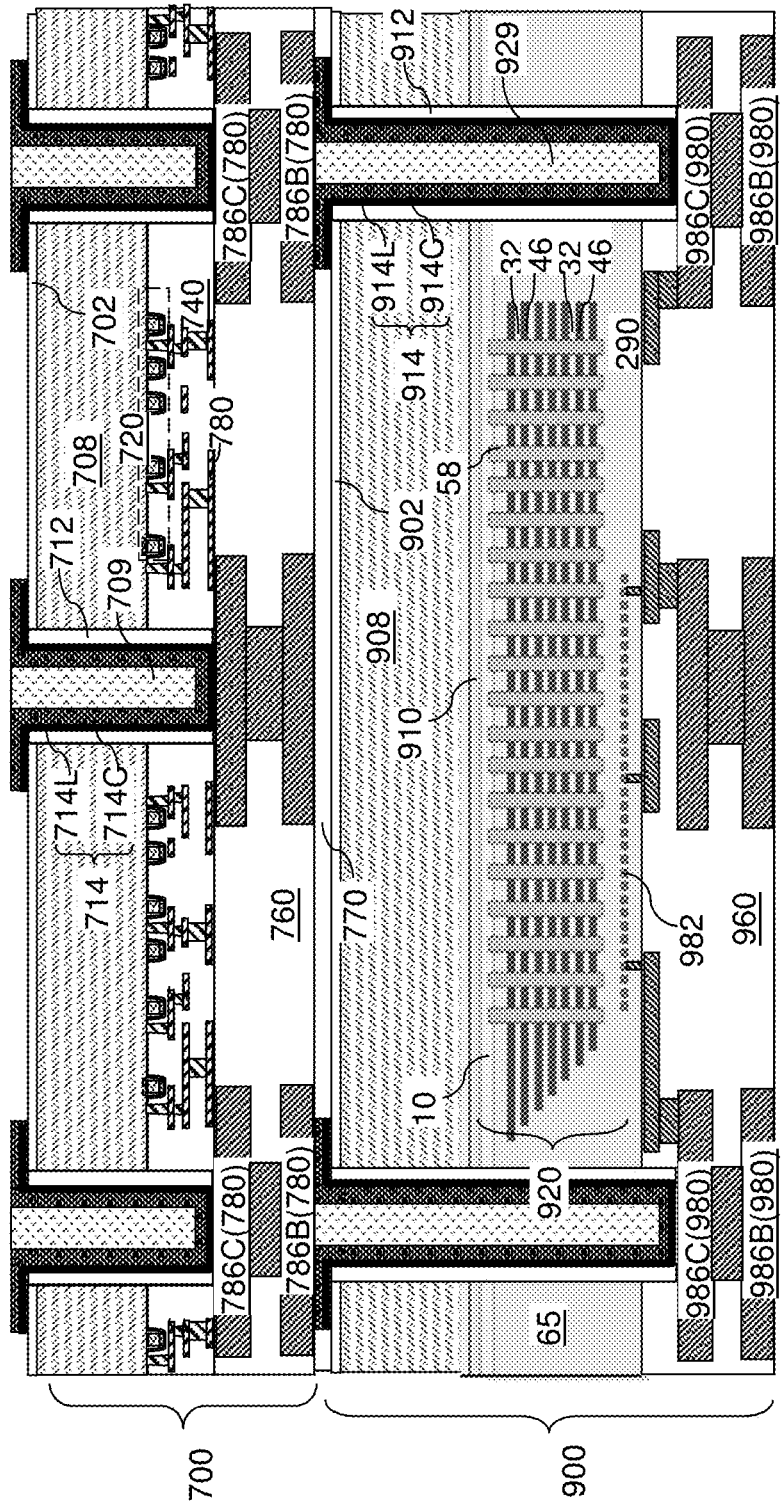
FIG. 18 is an alternative configuration of the first exemplary structure including a bonded assembly of the first semiconductor die, the second semiconductor die, and a third semiconductor die according to the second embodiment of the present disclosure.

Referring to FIG. 18, an alternative configuration of the first semiconductor die 900 is illustrated, which can be derived from the first semiconductor die of FIG. 17 by filling the core cavities 919 with a dielectric fill material. A dielectric fill material portion 929 is formed within each of the core cavities 919. The dielectric fill material can be deposited by a self-planarizing deposition method (such as spin-coating) or a conformal deposition method (such as low pressure chemical vapor deposition). In one embodiment, the dielectric fill material can have a dielectric constant less than 3.0. Exemplary dielectric fill materials include a dielectric polymer material (such as polyimide), undoped silicate glass, a doped silicate glass, and organosilicate glass. In one embodiment, the dielectric fill material portions 929 can include a material that can be removed selective to the material of the first backside insulating layer 902. In this case, excess portions of the dielectric fill material can be removed from above the top surface of the first backside insulating layer 902 by a recess etch process. In one embodiment, the dielectric fill material includes a dielectric polymer material (such as polyimide).

In other alternative embodiments, the core cavities (719, 919) of the first, second and/or third semiconductor die of any embodiment or configuration described above may be filled with the dielectric fill material.

Referring to all drawings and according to various embodiments of the present disclosure, a bonded assembly is provided, which comprises: a first semiconductor die 900 comprising a first substrate 908, first semiconductor devices located on the first substrate 908, first dielectric material layers (290, 960, 970) located on the first semiconductor devices and embedding first metal interconnect structures 980, and first through-substrate via structures 914 extending through the first substrate 908 and contacting a respective one of the first metal interconnect structures 980, wherein each of the first through-substrate via structures 914 laterally surrounds a respective core cavity 919 that contains a void or a dielectric fill material portion 929; and a second semiconductor die attached to, and overlying or underlying, the first semiconductor die 900, and comprising a second substrate 708, second semiconductor devices 720 located on the second substrate 708, second dielectric material layers (740, 760, 770) located on the second semiconductor devices 720 and embedding second metal interconnect structures 780, and bonding pad structures (such as second bonding pad structures 786C) electrically connected to a respective one of the second metal interconnect structures 780 and bonded to a respective one of the first through-substrate via structures 914.

In one embodiment, the first semiconductor die 900 comprises a memory die including a three-dimensional array of memory elements, and the second semiconductor die 700 comprises a logic die including a peripheral circuitry configured to control operation of the three-dimensional array of memory elements.

In one embodiment, the first semiconductor die 900 comprises a backside insulating layer 902 contacting a backside surface of the first substrate 908; and each of the first through-substrate via structures 914 contacts a horizontal surface of the backside insulating layer 908. In one embodiment, each of the first through-substrate via structures 914 comprises a respective metallic liner 914L contacting a horizontal surface of a respective one of the first metal interconnect structures 980 and an annular portion of the horizontal surface of the backside insulating layer 902.

In one embodiment, each of the first through-substrate via structures 914 comprises a respective metal layer 914C consisting essentially of at least one elemental metal and laterally enclosing the void or the dielectric fill material portion 929. In one embodiment, the respective metal layer 914C consists essentially of copper and contacts an inner sidewall of the metallic liner 914L as a metal layer 914C.

In one embodiment, each of the bonding pad structures (such as second bonding pad structures 786C) is bonded to the respective one of the first through-substrate via structures 914 through a respective solder material portion 792.

In one embodiment, each of the bonding pad structure (such as second bonding pad structures 786C) is bonded to the respective one of the first through-substrate via structures 914 by metal-to-metal bonding.

In one embodiment, cylindrical insulating spacers 912 can vertically extend through at least the first substrate 908. Each of the first through-substrate via structures 914 extends through, and contacts an inner sidewall of, a respective one of the cylindrical insulating spacers 912. In one embodiment, the respective one of the first metal interconnect structures 980 is in contact with an annular bottom surface of a respective one of the cylindrical insulating spacers 912.

In one embodiment illustrated in FIGS. 11A and 11B, the bonded assembly comprises a third semiconductor die 900' attached to the first semiconductor die 900, and comprising a third substrate 908', third semiconductor devices 920' located on the third substrate 908', third dielectric material layers (290', 960', 970') located on the third semiconductor devices 920' and embedding third metal interconnect structures 980', and additional through-substrate via structures 714' extending through the third substrate 908' and electrically connected to a respective one of the third metal interconnect structures 980' and bonded to a respective one of additional bonding pad structures (such as first bonding pad structures 986C) within the first semiconductor die 900.

By not filling the entire volume of through-substrate via openings, the processing cost and the processing time for forming through-substrate via structures can be reduced without significant impact on the conductivity of the through-substrate via structures. The through-substrate via structures may include voids therein, or may include dielectric fill material portions to assist mechanical stability of the through-substrate via structures.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
a first semiconductor die comprising a first substrate, first semiconductor devices located on the first substrate, first dielectric material layers located on the first semiconductor devices and embedding first metal interconnect structures, and first through-substrate via structures extending through the first substrate and the first semiconductor devices and contacting a respective one of the first metal interconnect structures, wherein each of the first through-substrate via structures laterally surrounds a respective core cavity that contains a void or a dielectric fill material portion; and
a second semiconductor die attached to the first semiconductor die, and comprising a second substrate, second semiconductor devices located on the second substrate, second dielectric material layers located on the second semiconductor devices and embedding second metal interconnect structures, and bonding pad structures electrically connected to a respective one of the second metal interconnect structures and bonded to a respective one of the first through-substrate via structures;
wherein:
the first semiconductor die comprises a memory die and the first semiconductor devices include a three-dimensional array of memory elements; and
the second semiconductor die comprises a logic die including a peripheral circuitry configured to control operation of the three-dimensional array of memory elements.

2. The bonded assembly of claim 1, wherein:
the first semiconductor die comprises a backside insulating layer contacting a backside surface of the first substrate; and
each of the first through-substrate via structures contacts a horizontal surface of the backside insulating layer.

3. The bonded assembly of claim 2, wherein each of the first through-substrate via structures comprises a respective metallic liner contacting a horizontal surface of a respective one of the first metal interconnect structures and an annular portion of the horizontal surface of the backside insulating layer.

4. The bonded assembly of claim 3, wherein each of the first through-substrate via structures further comprises a respective metal layer consisting essentially of at least one elemental metal and laterally enclosing the void or the dielectric fill material portion.

5. The bonded assembly of claim 4, wherein the respective metal layer consists essentially of copper and contacts an inner sidewall of the metallic liner.

6. The bonded assembly of claim 1, wherein each of the bonding pad structures is bonded to the respective one of the first through-substrate via structures through a respective solder material portion.

7. The bonded assembly of claim 1, wherein each of the bonding pad structure is bonded to the respective one of the first through-substrate via structures by metal-to-metal bonding.

8. The bonded assembly of claim 1, further comprising cylindrical insulating spacers vertically extending through at least the first substrate, wherein each of the first through-substrate via structures extends through, and contacts an inner sidewall of, a respective one of the cylindrical insulating spacers.

9. The bonded assembly of claim 8, wherein the respective one of the first metal interconnect structures is in contact with an annular bottom surface of a respective one of the cylindrical insulating spacers.

10. The bonded assembly of claim 1, further comprising a third semiconductor die attached to the first semiconductor die, and comprising a third substrate, third semiconductor devices located on the third substrate, third dielectric material layers located on the third semiconductor devices and embedding third metal interconnect structures, and additional through-substrate via structures extending through the third substrate and electrically connected to a respective one of the third metal interconnect structures and bonded to a respective one of additional bonding pad structures within the first semiconductor die.

11. The bonded assembly of claim 1, wherein the first semiconductor devices comprise a dielectric material portion around the three-dimensional array of memory elements, and at least one of the first through-substrate via structures extends through the dielectric material portion around the three-dimensional array of memory elements.

12. The bonded assembly of claim 1, wherein at least one of the first through-substrate via structures laterally surrounds a respective core cavity that contains a void.

13. A bonded assembly comprising:
- a first semiconductor die comprising a first substrate, first semiconductor devices located on the first substrate, first dielectric material layers located on the first semiconductor devices and embedding first metal interconnect structures, and first through-substrate via structures extending through the first substrate and the first semiconductor devices and contacting a respective one of the first metal interconnect structures, wherein each of the first through-substrate via structures laterally surrounds a respective core cavity that contains a void or a dielectric fill material portion;
- a second semiconductor die attached to the first semiconductor die, and comprising a second substrate, second semiconductor devices located on the second substrate, second dielectric material layers located on the second semiconductor devices and embedding second metal interconnect structures, and bonding pad structures electrically connected to a respective one of the second metal interconnect structures and bonded to a respective one of the first through-substrate via structures; and
- a third semiconductor die attached to the first semiconductor die, and comprising a third substrate, third semiconductor devices located on the third substrate, third dielectric material layers located on the third semiconductor devices and embedding third metal interconnect structures, and additional through-substrate via structures extending through the third substrate and the third semiconductor devices and electrically connected to a respective one of the third metal interconnect structures and bonded to a respective one of additional bonding pad structures within the first semiconductor die, wherein each of the each of the additional through-substrate via structures laterally surrounds a respective core cavity that contains a void or a dielectric fill material portion, and wherein:
- at least one of the first semiconductor die and the third semiconductor die comprises a memory die and at least one of the first semiconductor devices and the third semiconductor devices comprise a three-dimensional array of memory elements.

14. The bonded assembly of claim 13, wherein at least one of the first semiconductor devices and the third semiconductor devices comprise a dielectric portion around a three-dimensional array of memory elements, and the at least one through-substrate via structure laterally surrounding the core cavity that contains the void or the dielectric fill material portion extends through the dielectric material portion around the three-dimensional array of memory elements.

15. The bonded assembly of claim 13, wherein at least one of the through-substrate via structures laterally surrounds a respective core cavity that contains the void.

* * * * *